(12) United States Patent
Zhang et al.

(10) Patent No.: US 10,868,042 B1
(45) Date of Patent: Dec. 15, 2020

(54) FERROELECTRIC MEMORY DEVICE CONTAINING WORD LINES AND PASS GATES AND METHOD OF FORMING THE SAME

(71) Applicant: SANDISK TECHNOLOGIES LLC, Addison, TX (US)

(72) Inventors: Yanli Zhang, San Jose, CA (US); Johann Alsmeier, San Jose, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/457,687

(22) Filed: Jun. 28, 2019

(51) Int. Cl.
| H01L 27/115 | (2017.01) |
| H01L 29/51 | (2006.01) |
| H01L 27/11597 | (2017.01) |
| H01L 27/11587 | (2017.01) |

(52) U.S. Cl.
CPC .. *H01L 27/11597* (2013.01); *H01L 27/11587* (2013.01); *H01L 29/516* (2013.01)

(58) Field of Classification Search
CPC ......... H01L 27/11597; H01L 27/11587; H01L 29/516
USPC ....................................................... 257/295
See application file for complete search history.

(56) References Cited

U.S. PATENT DOCUMENTS

| 7,842,989 B2 | 11/2010 | Kato |
| 9,355,727 B1 | 5/2016 | Zhang et al. |
| 9,576,971 B2 | 2/2017 | Zhang et al. |
| 9,941,299 B1 | 4/2018 | Chen et al. |
| 2016/0118404 A1* | 4/2016 | Peng ................. H01L 27/11507 257/295 |
| 2016/0163389 A1 | 6/2016 | Zhang et al. |
| 2016/0163729 A1 | 6/2016 | Zhang et al. |
| 2017/0098655 A1 | 4/2017 | Costa et al. |

OTHER PUBLICATIONS

U.S. Appl. No. 16/227,889, filed Dec. 20, 2018, Sandisk Technologies LLC.
U.S. Appl. No. 16/249,300, filed Jan. 16, 2019, Sandisk Technologies LLC.
U.S. Appl. No. 16/291,673, filed Mar. 4, 2019, Sandisk Technologies LLC.
U.S. Appl. No. 16/374,330, filed Apr. 3, 2019, Sandisk Technologies LLC.
U.S. Appl. No. 16/412,764, filed May 15, 2019, Sandisk Technologies LLC.
U.S. Appl. No. 16/454,458, filed Jun. 27, 2019, Sandisk Technologies LLC.
U.S. Appl. No. 16/454,475, filed Jun. 27, 2019, Sandisk Technologies LLC.
U.S. Appl. No. 16/456,736, filed Jun. 28, 2019, Sandisk Technologies LLC.

(Continued)

Primary Examiner — Caleen O Sullivan
(74) Attorney, Agent, or Firm — The Marbury Law Group PLLC

(57) ABSTRACT

A memory device includes a semiconductor channel extending between a source region and a drain region, a plurality of pass gate electrodes, a plurality of word lines, a gate dielectric located between the semiconductor channel and the plurality of pass gate electrodes, and ferroelectric material portions located between the semiconductor channel and the plurality of word lines.

20 Claims, 22 Drawing Sheets

(56) References Cited

OTHER PUBLICATIONS

U.S. Appl. No. 16/457,721, filed Jun. 28, 2019, Sandisk Technologies LLC.
USPTO Office Communication, Notice of Allowance and Fee(s) Due, for U.S. Appl. No. 16/457,721, dated Jun. 18, 2020, 14 pages.
Notification of Transmittal of the International Search Report and Written Opinion of the International Search Authority for International Patent Application No. PCT/US2019/068871, dated Apr. 30, 2020, 9 pages.

* cited by examiner

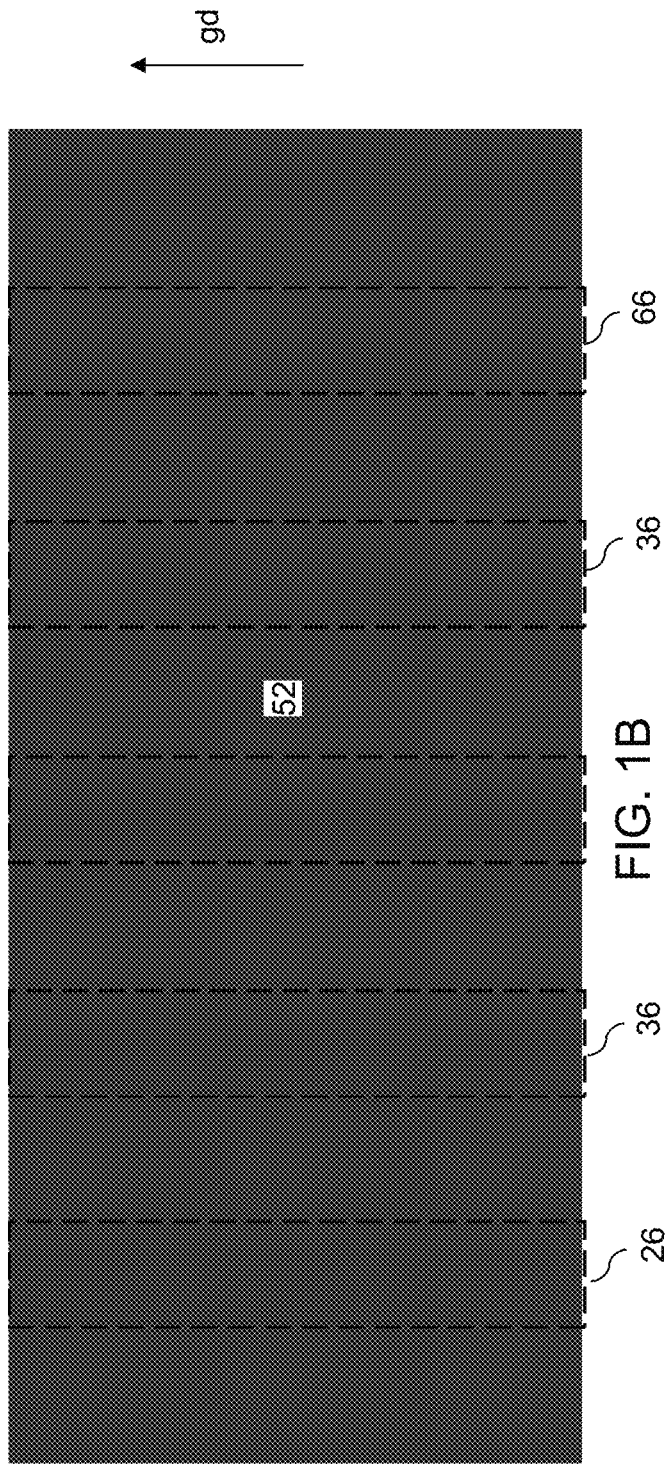
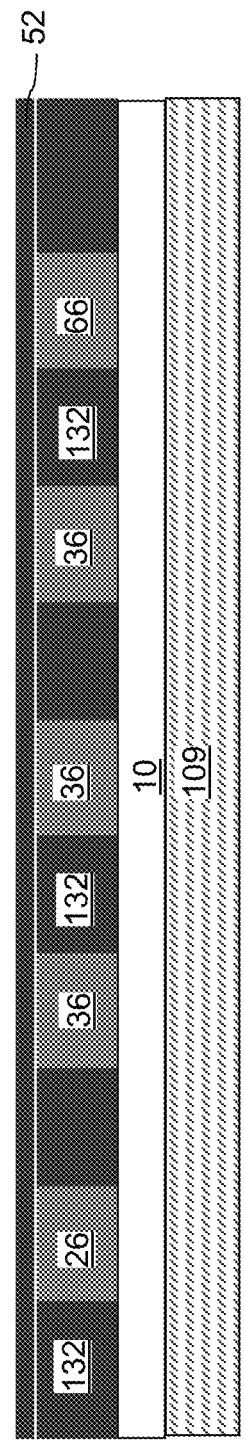

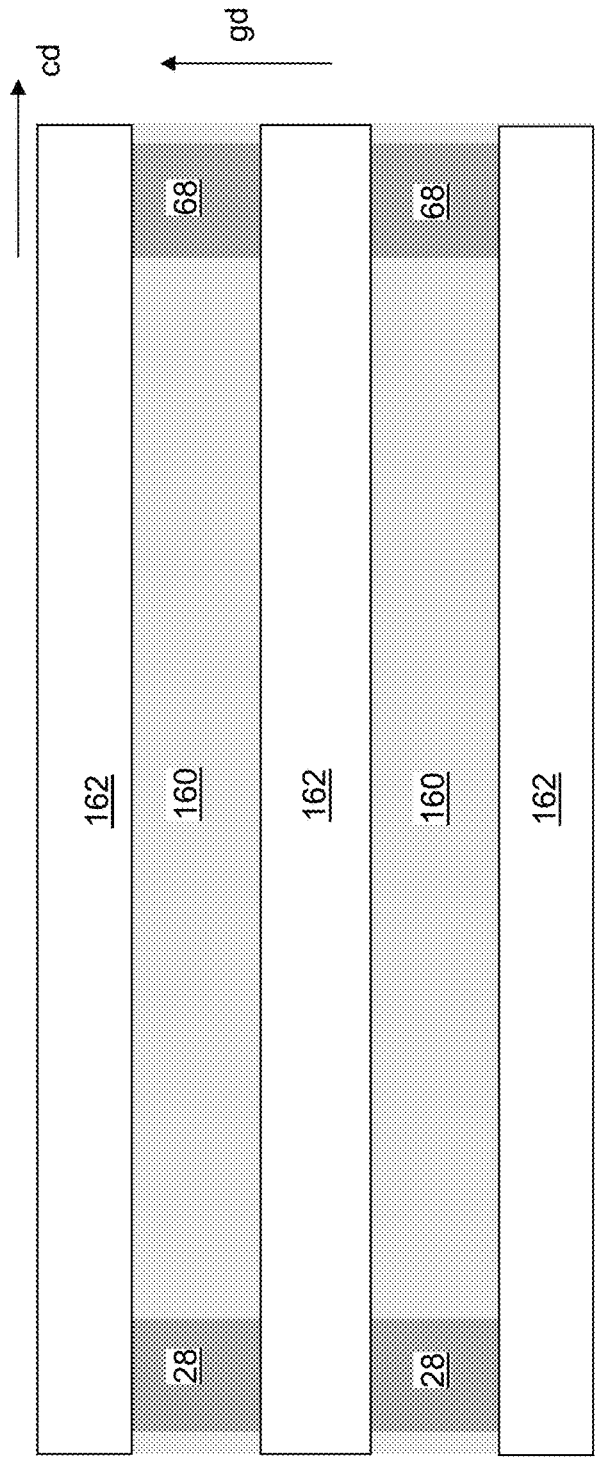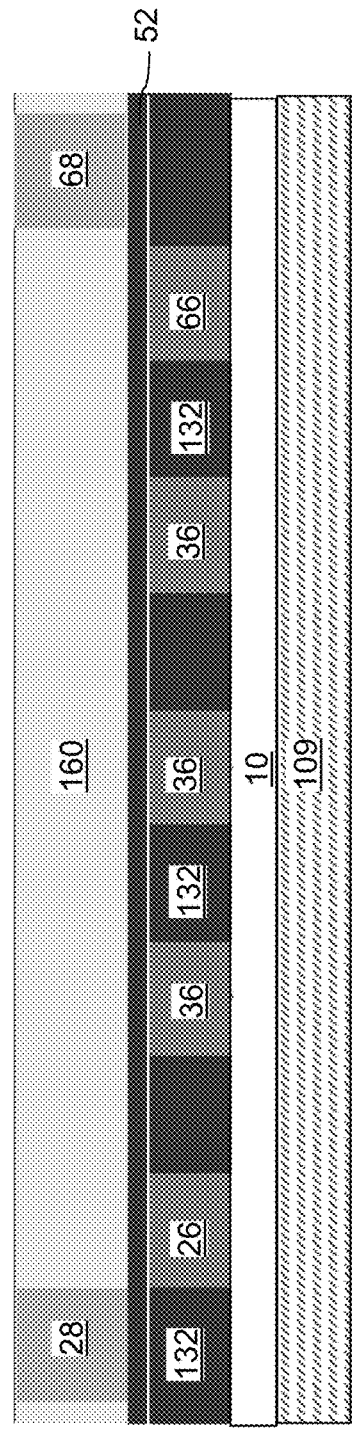
FIG. 2B
FIG. 2A

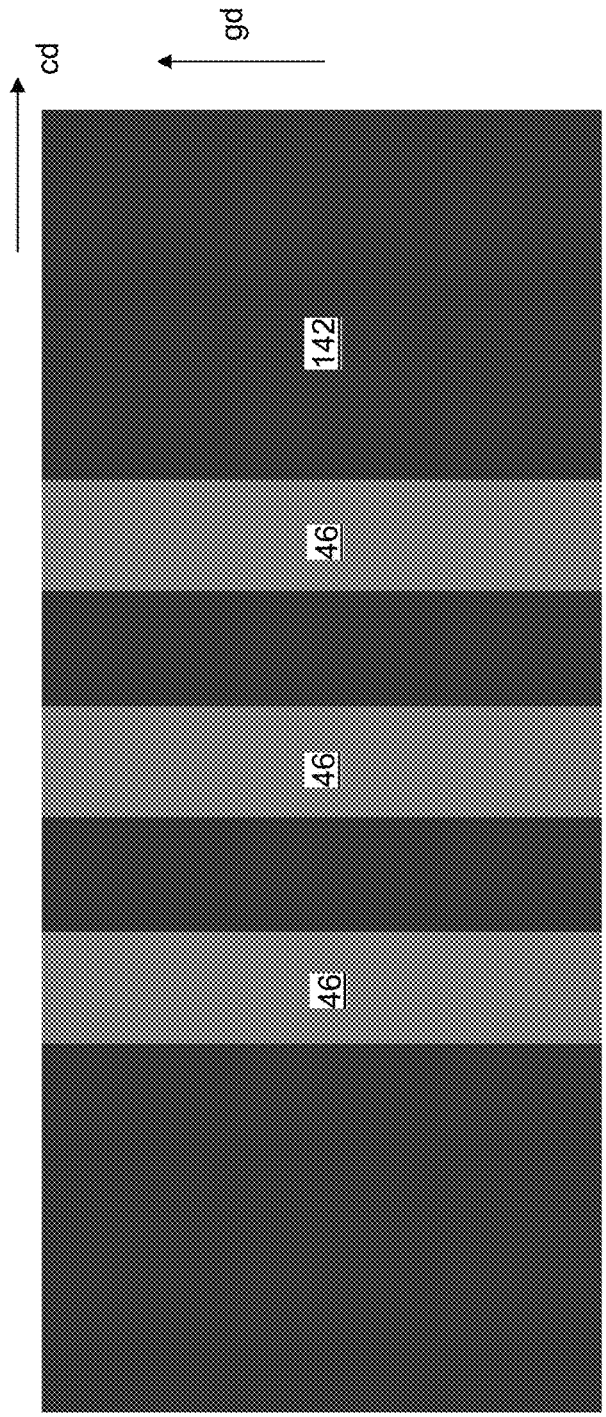
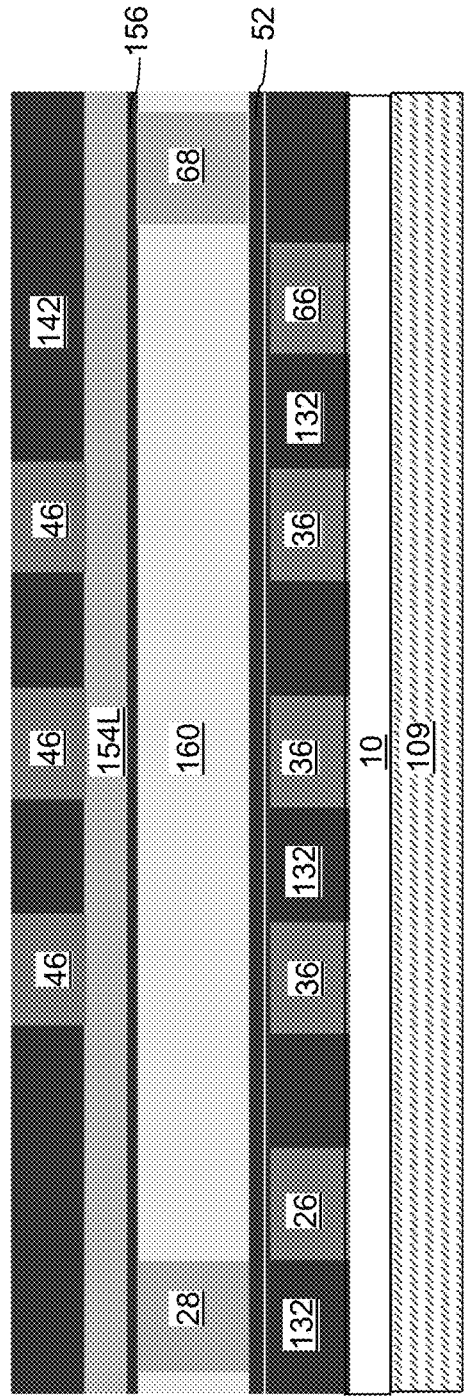
FIG. 3B
FIG. 3A

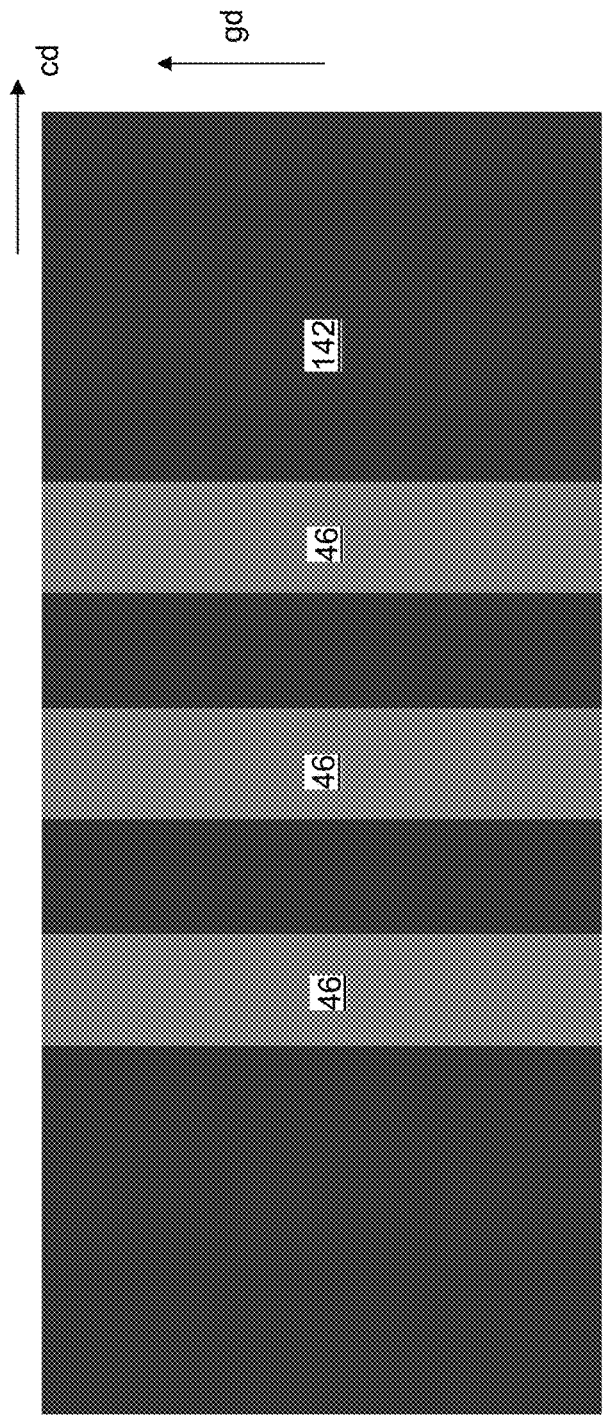
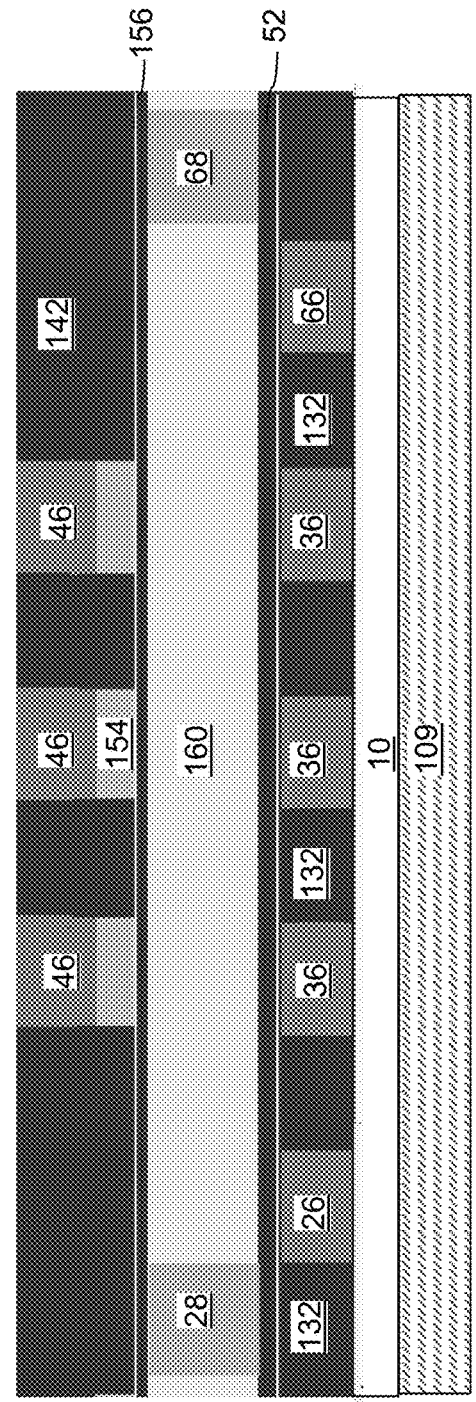
FIG. 4B
FIG. 4A

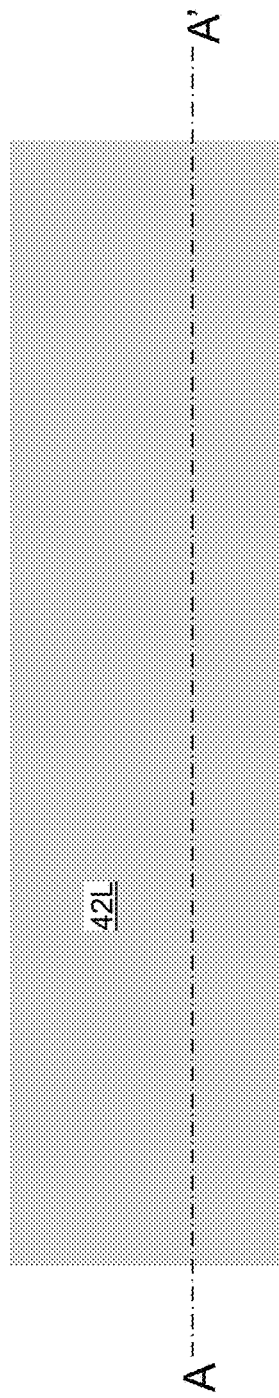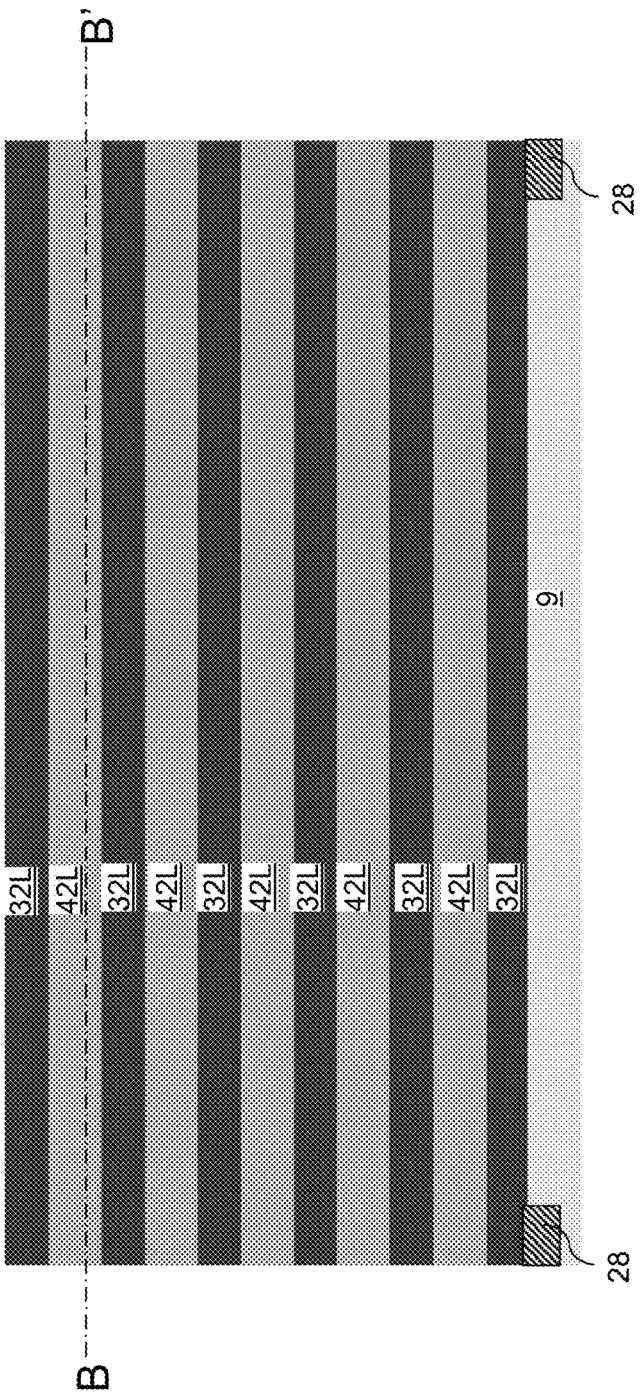

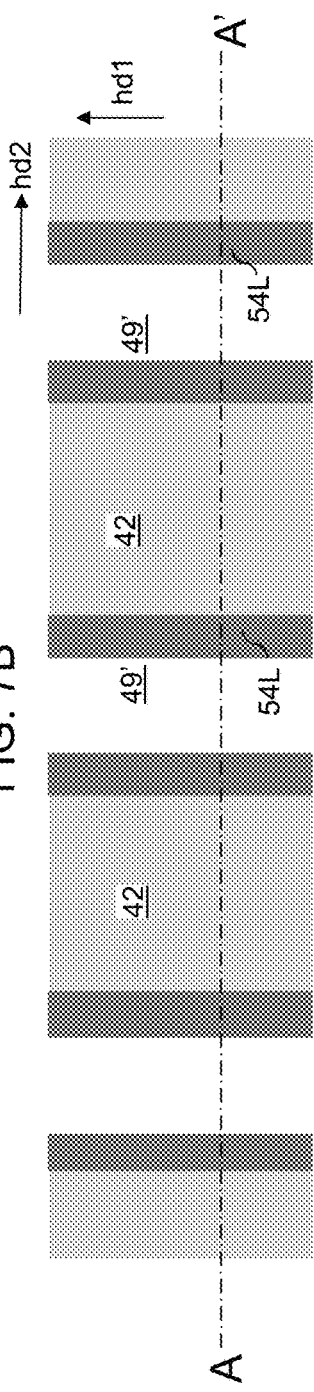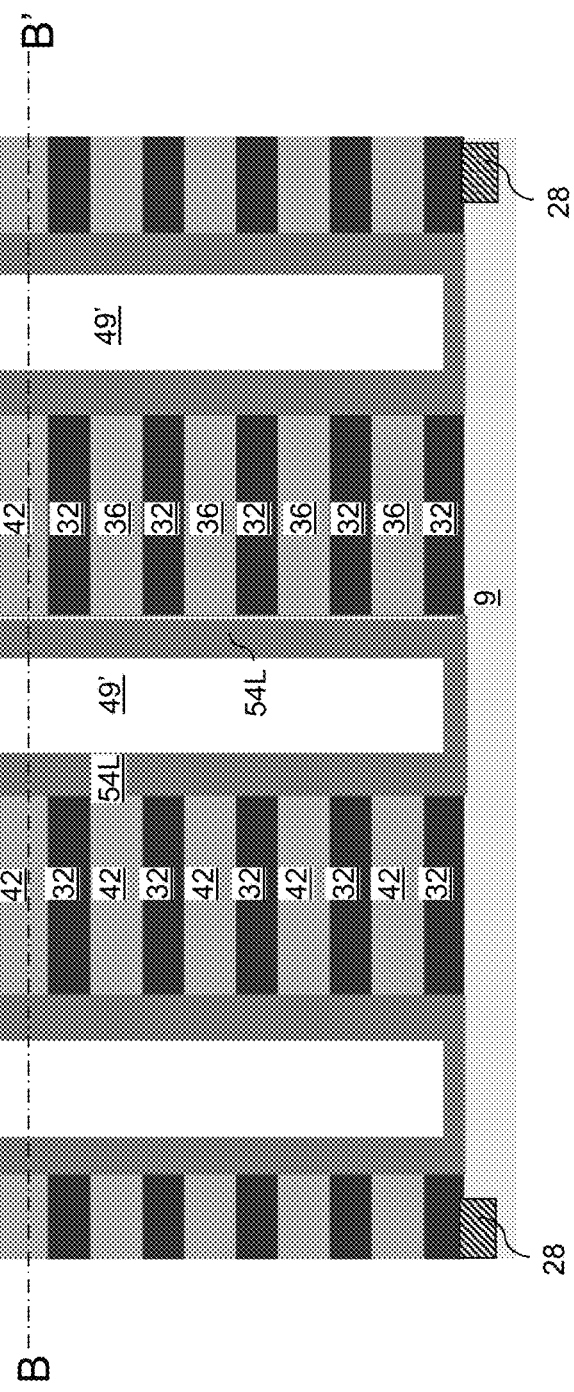
FIG. 7B
FIG. 7A

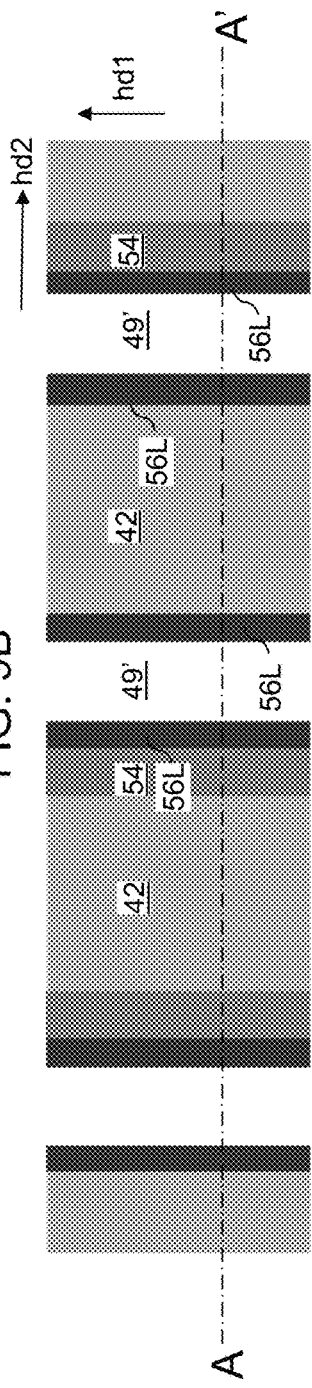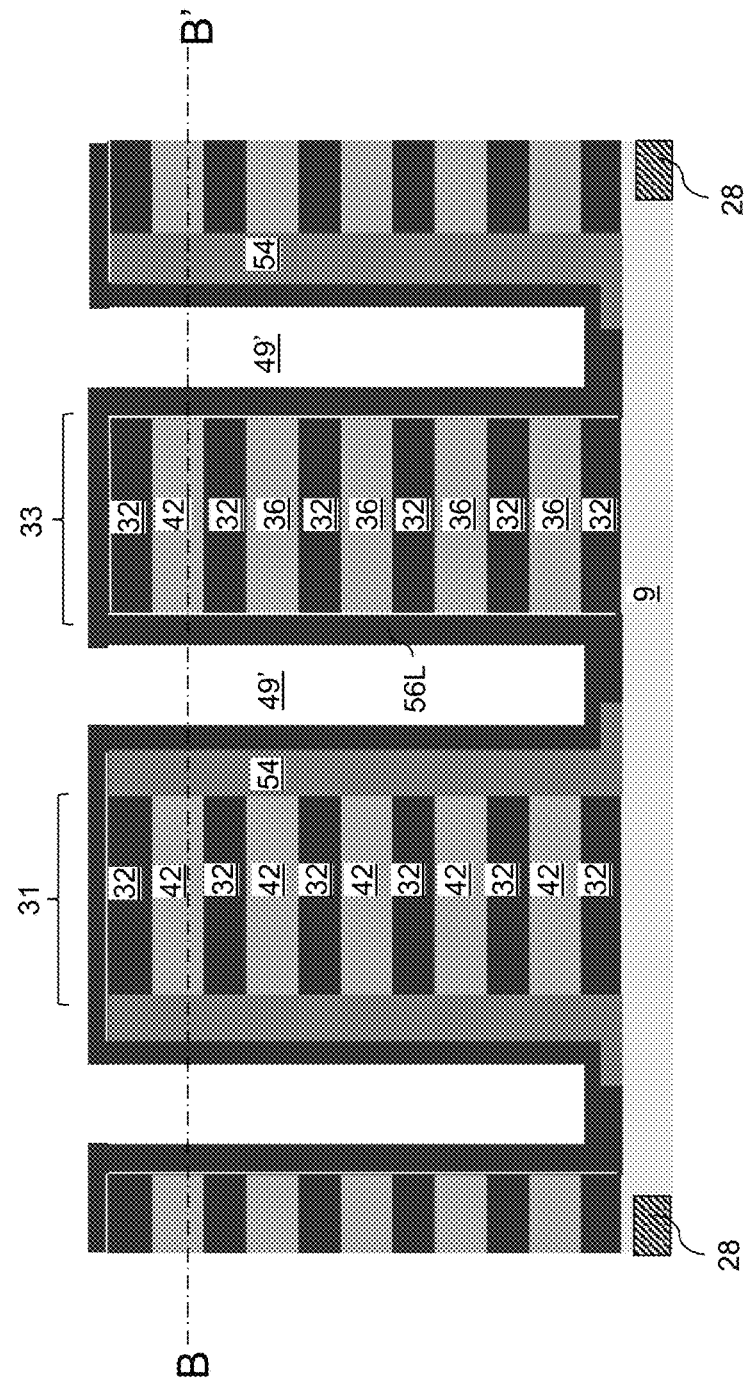

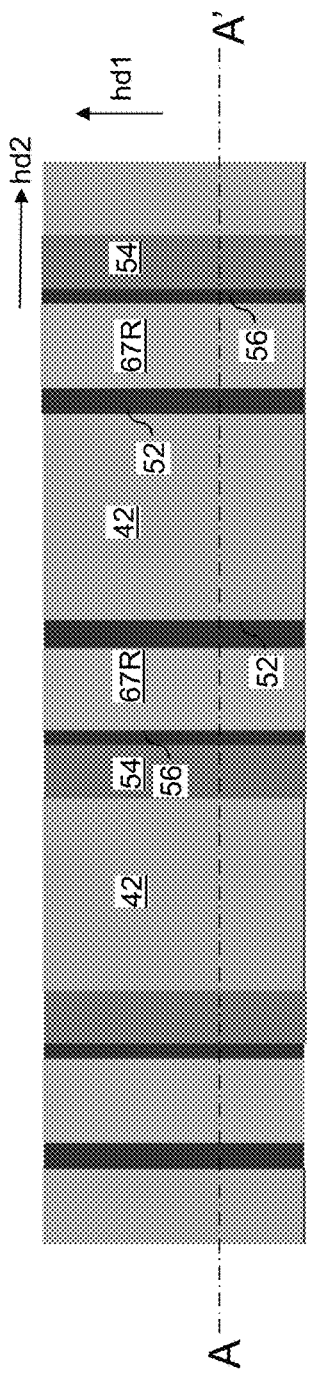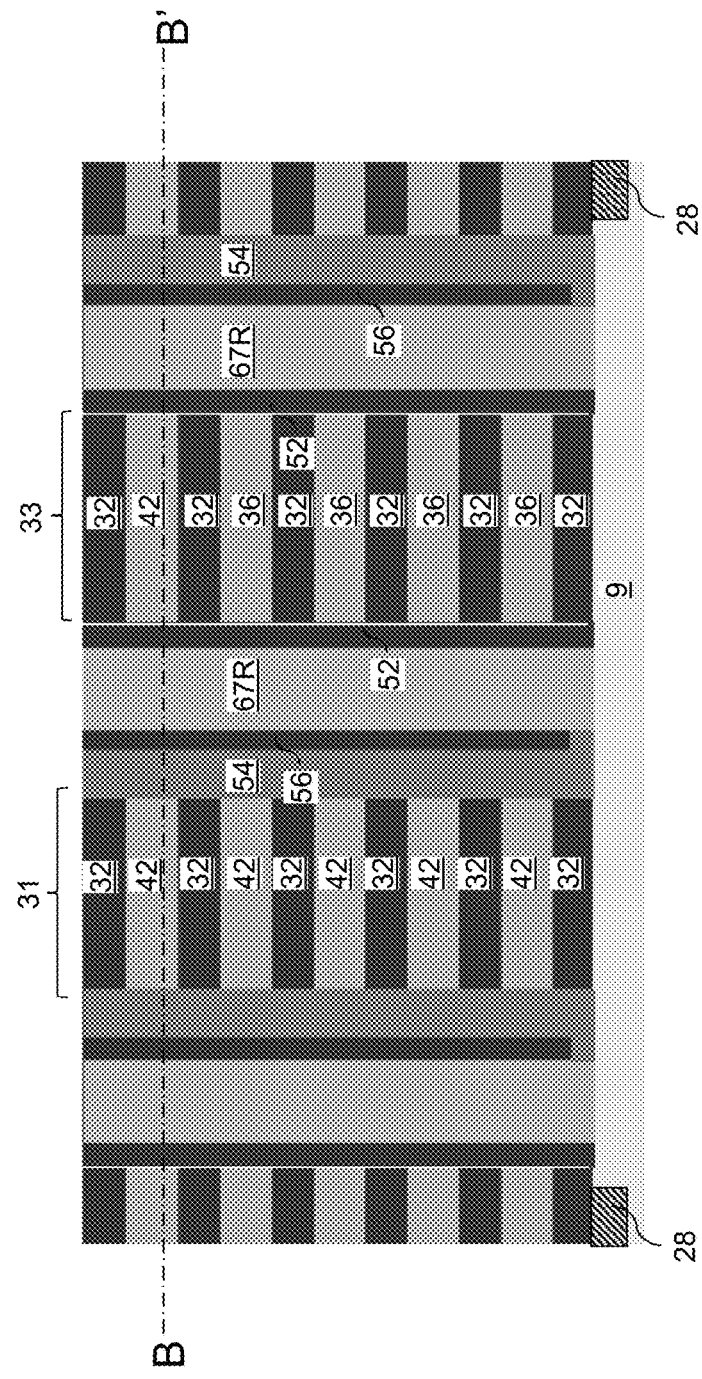
FIG. 10B
FIG. 10A

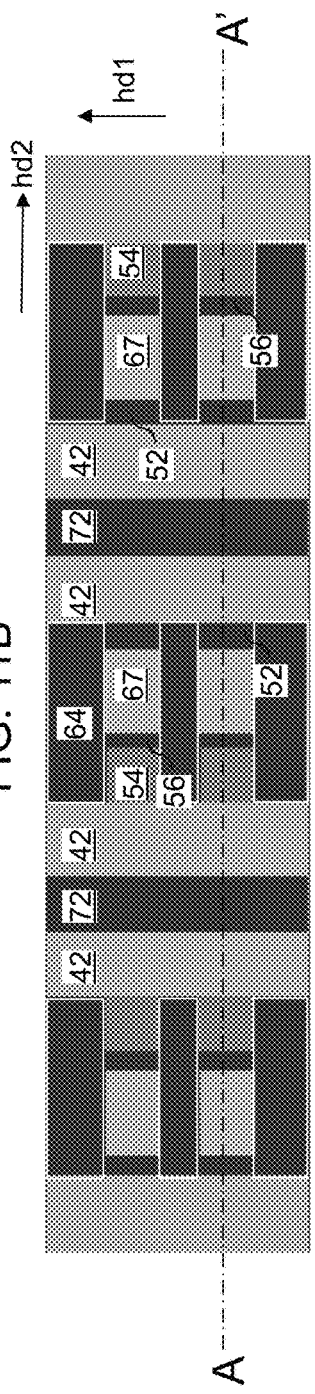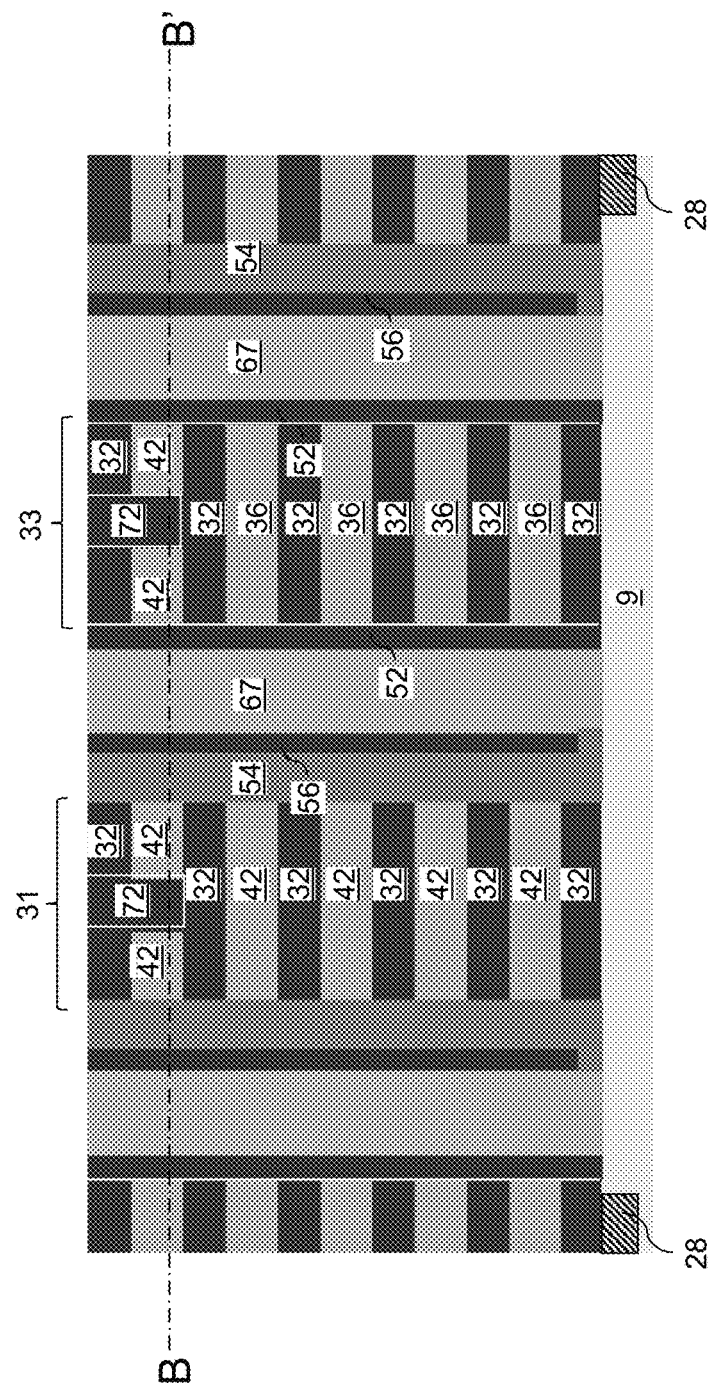
FIG. 11B
FIG. 11A

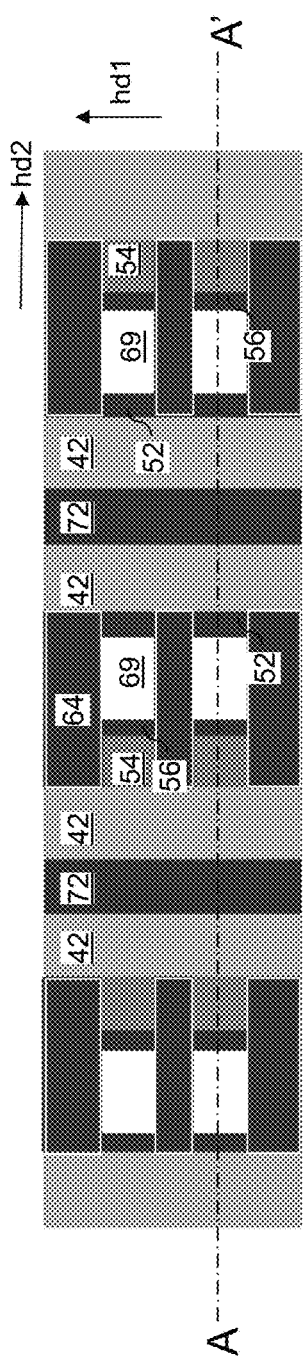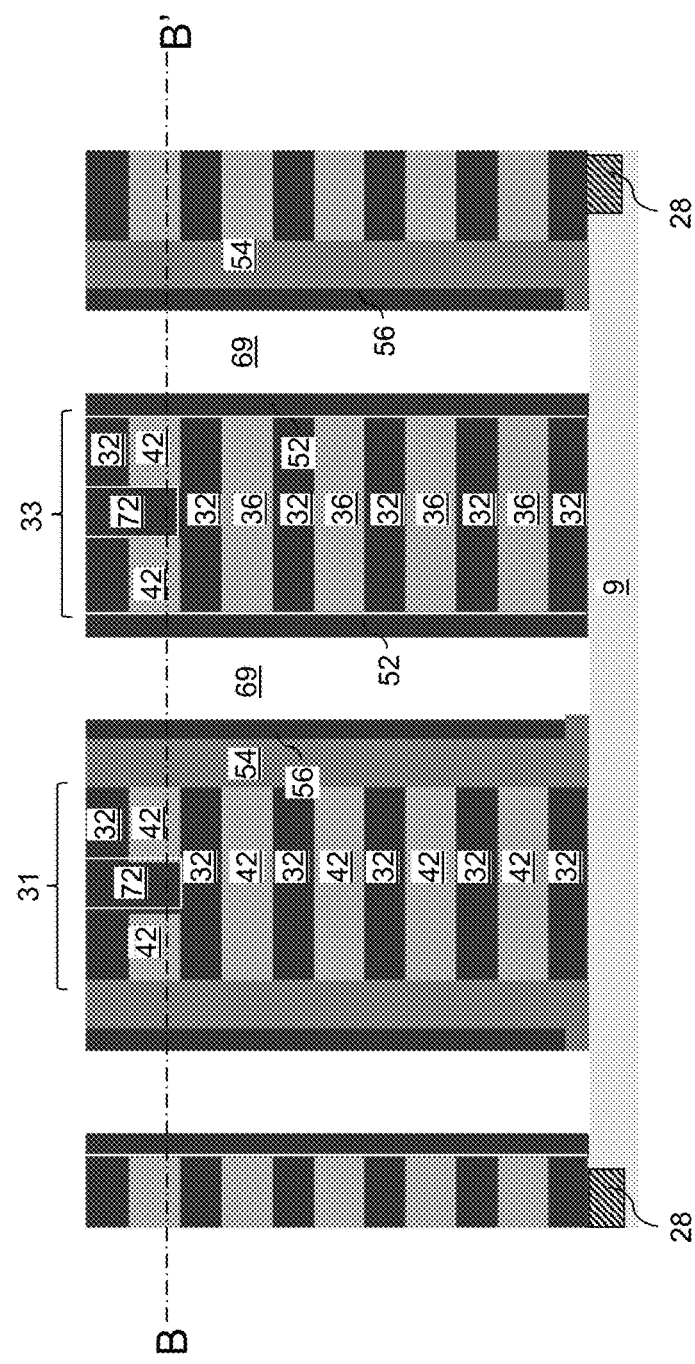
FIG. 12B
FIG. 12A

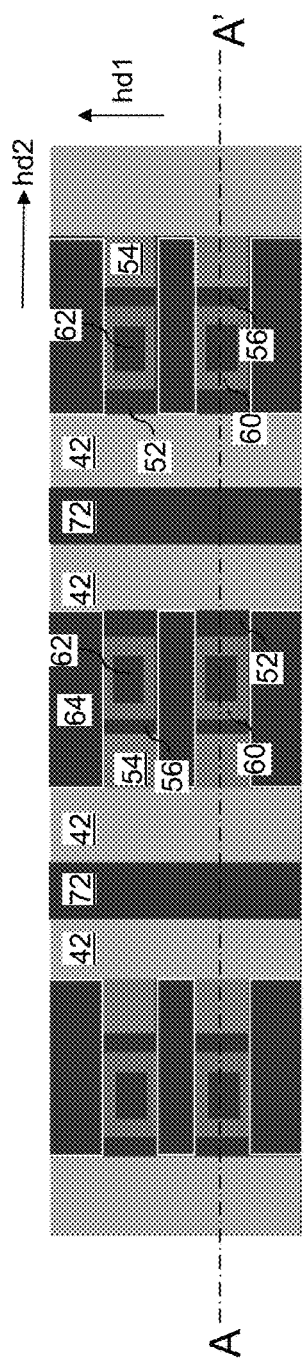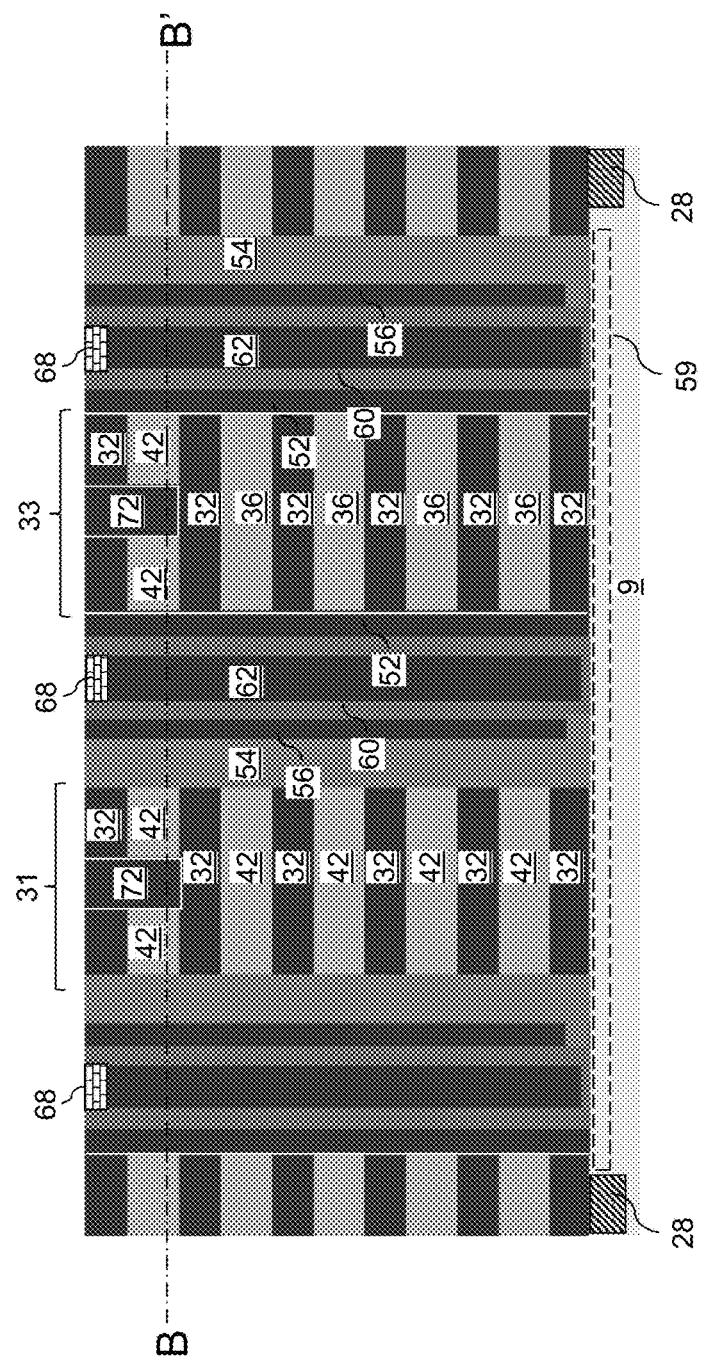
FIG. 13B
FIG. 13A

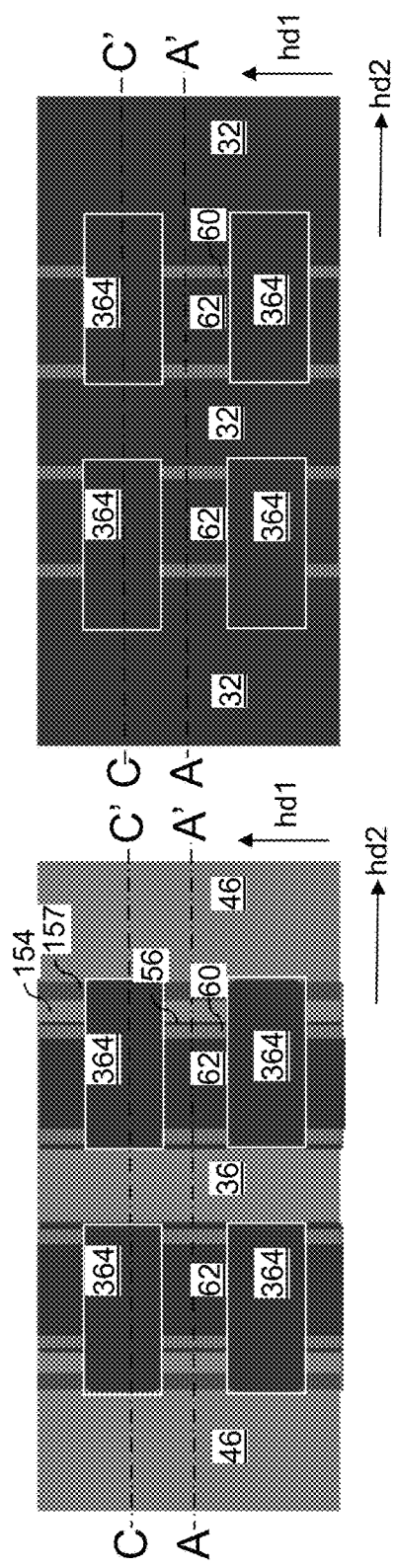
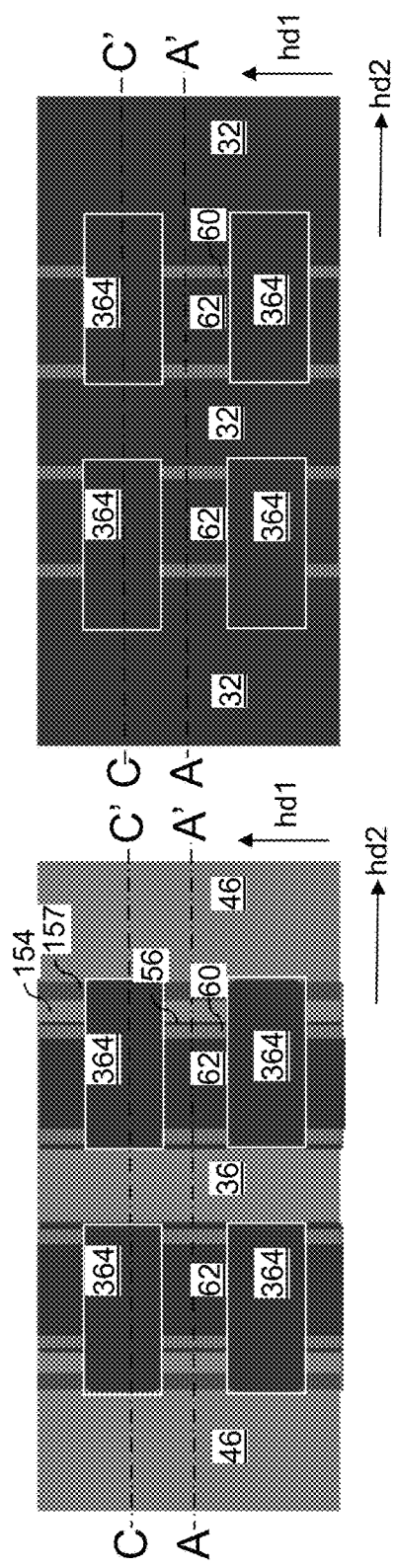
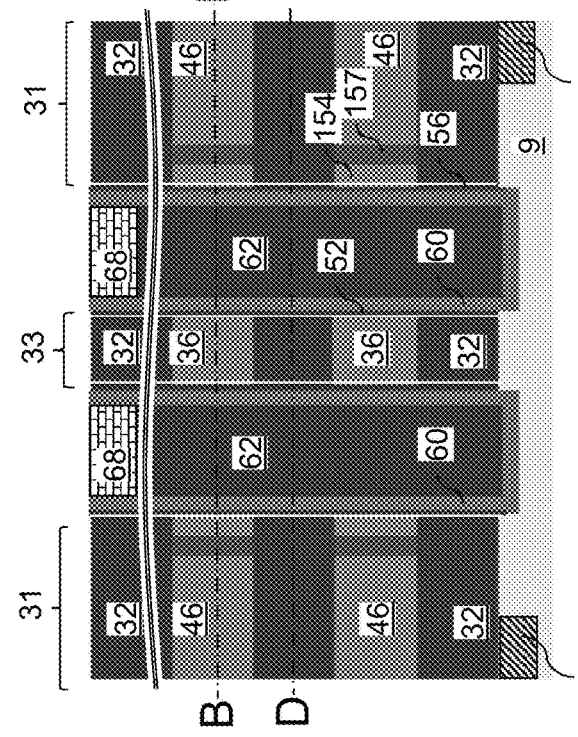
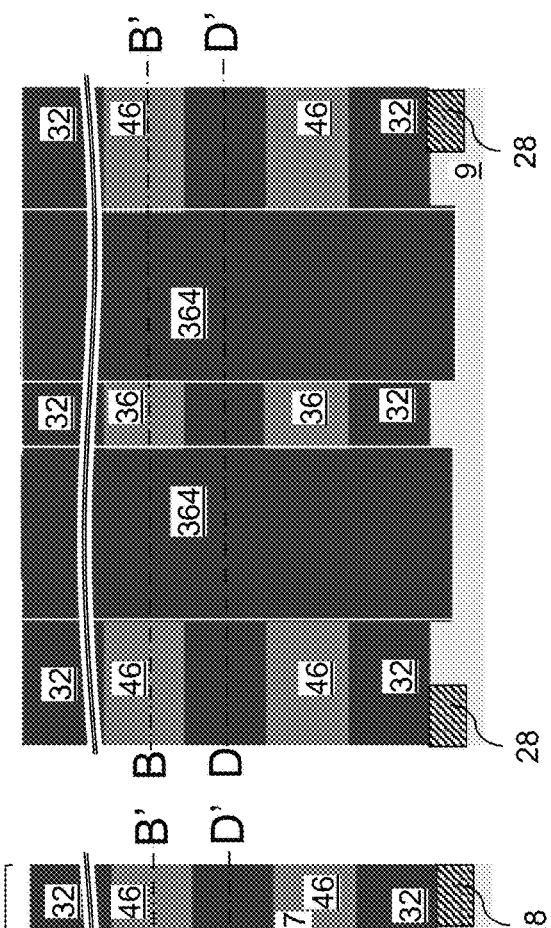
FIG. 14D
FIG. 14B
FIG. 14C
FIG. 14A

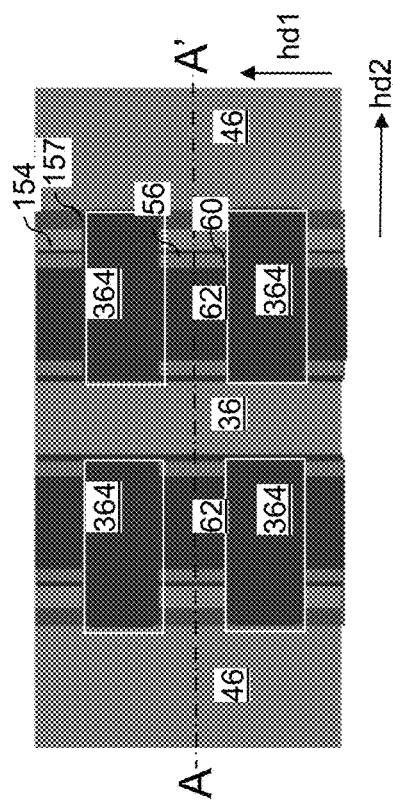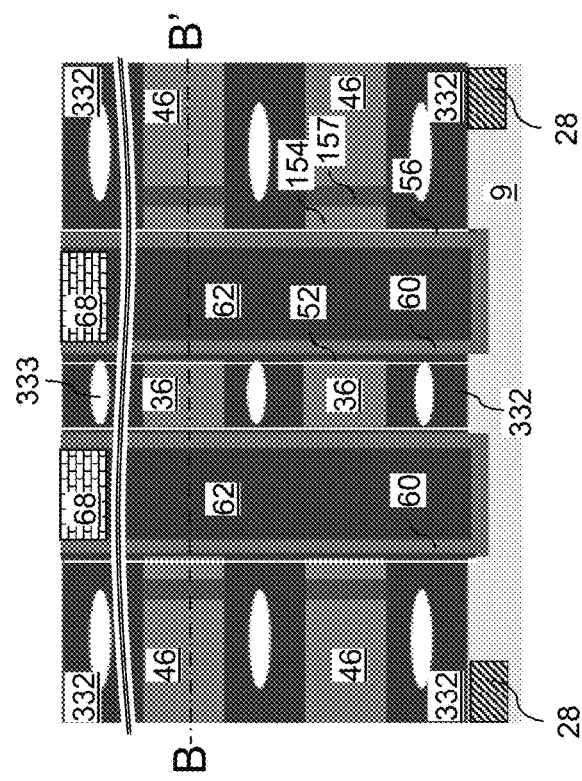
FIG. 15B
FIG. 15A

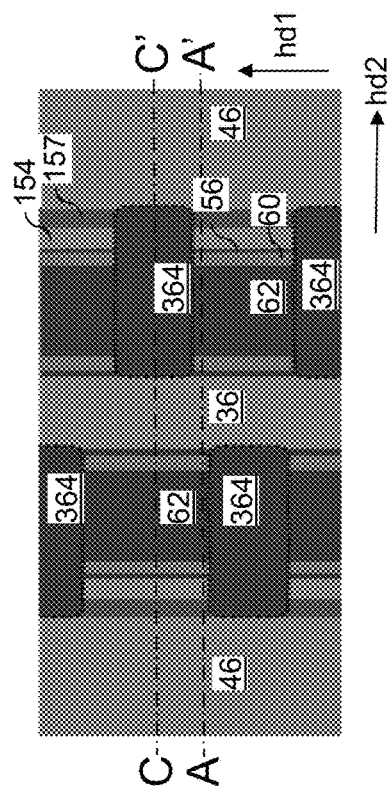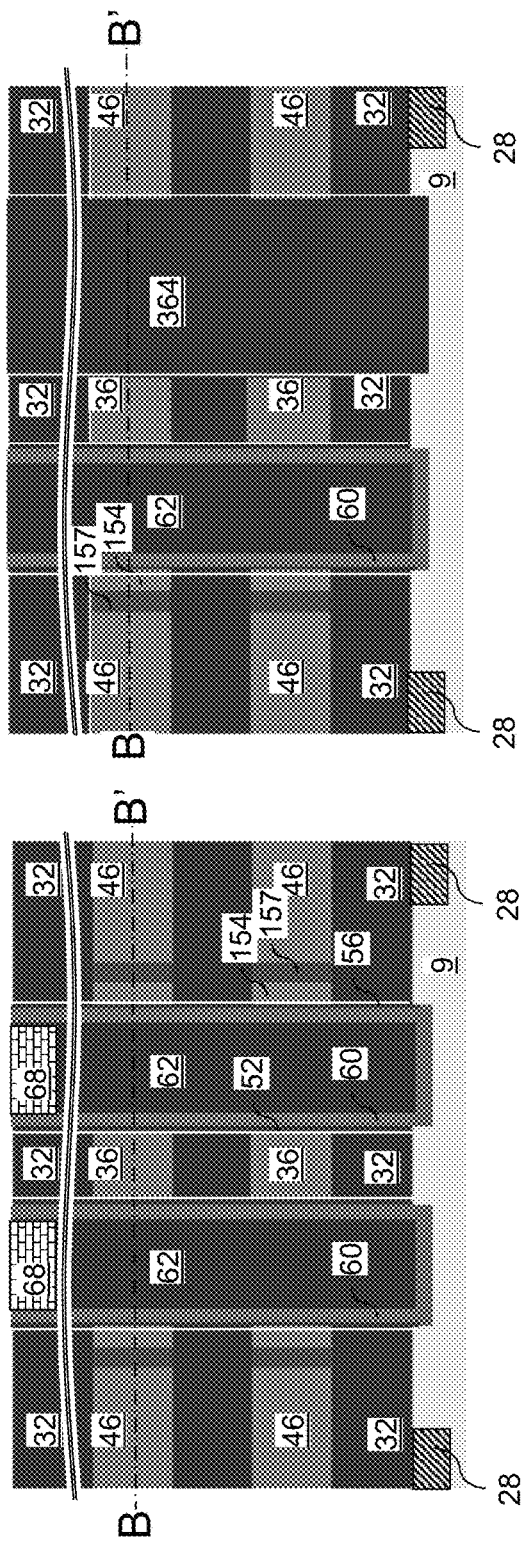
FIG. 16B
FIG. 16C
FIG. 16A

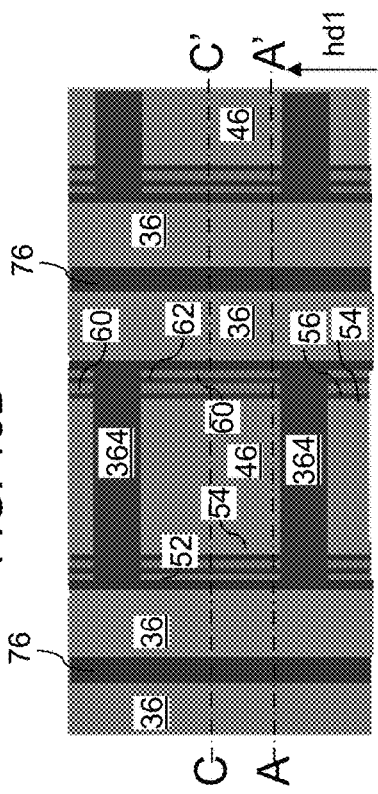

FIG. 21B

Channel Boosting | Direct Channel Potential Control

| | Write/Inhibit | Erase/Inhibit | Read/Inhibit | Write/Inhibit | Erase/Inhibit | Read/Inhibit |
|---|---|---|---|---|---|---|
| Sel. WL | -6V | 5V | 0V | -6V | 5V | 0V |
| Unsel. WL | float | float | 0V | float | float | 0V |
| Sel. PL | Vpass | Vpass | 0V | Vpass | Vpass | 0V |
| Unsel. PL | Vpass | Vpass | Vread | Vpass | Vpass | Vread |
| BL | 0V/1V | 0V/1V | Vdd | 0V/4V | 0V/4V | Vdd |
| SL | 2.2V | 2.2V | 0V | 2.2V | 2.2V | 0V |
| SGD device | On/Off | On/Off | On/Off | On | On | On/Off |
| SGS device | Off | Off | On | Off | Off | On |
| Oper. Unit | Per page | Per page | Per page | Per page | Per page | Per page |

FIG. 21C

Channel Boosting | Direct Channel Potential Control

| | Write/Inhibit | Erase/Inhibit | Read/Inhibit | Write/Inhibit | Erase/Inhibit | Read/Inhibit |
|---|---|---|---|---|---|---|
| Sel. WL | -6.5V | 4.5V | -0.25/0.25V | -6.5V | 4.5V | -0.25/0.25V |
| Unsel. WL | float | float | 0V | float | float | 0V |
| Sel. PL | Vpass | Vpass | 0V | Vpass | Vpass | 0V |
| Unsel. PL | Vpass | Vpass | Vread | Vpass | Vpass | Vread |
| BL | 0V/1V | 0V/1V | Vdd | 0V/4.3V | 0V/3.4V | Vdd |
| SL | 2.2V | 2.2V | 0V | 2.2V | 2.2V | 0V |
| SGD device | On/Off | On/Off | On/Off | On | On | On/Off |
| SGS device | Off | Off | On | Off | Off | On |
| Oper. Unit | Per page | Per page | Per page | Per page | Per page | Per page |

FERROELECTRIC MEMORY DEVICE CONTAINING WORD LINES AND PASS GATES AND METHOD OF FORMING THE SAME

FIELD

The present disclosure relates generally to the field of semiconductor memory devices, and in particular to ferroelectric memory devices containing word lines and pass gates and methods of manufacturing the same.

BACKGROUND

A ferroelectric material refers to a material that displays spontaneous polarization of electrical charges in the absence of an applied electric field. The net polarization P of electrical charges within the ferroelectric material is non-zero in the minimum energy state. Thus, spontaneous ferroelectric polarization of the material occurs, and the ferroelectric material accumulates surfaces charges of opposite polarity types on two opposing surfaces. Polarization P of a ferroelectric material as a function of an applied voltage V thereacross displays hysteresis. The product of the remanent polarization and the coercive field of a ferroelectric material is a metric for characterizing effectiveness of the ferroelectric material.

A ferroelectric memory device is a memory device containing the ferroelectric material which is used to store information. The ferroelectric material acts as the memory material of the memory device. The dipole moment of the ferroelectric material is programmed in two different orientations (e.g., "up" or "down" polarization positions based on atom positions, such as oxygen and/or metal atom positions, in the crystal lattice) depending on the polarity of the applied electric field to the ferroelectric material to store information in the ferroelectric material. The different orientations of the dipole moment of the ferroelectric material can be detected by the electric field generated by the dipole moment of the ferroelectric material. For example, the orientation of the dipole moment can be detected by measuring electrical current passing through a semiconductor channel provided adjacent to the ferroelectric material in a field effect transistor ferroelectric memory device.

SUMMARY

According to an embodiment of the present disclosure, a memory device includes a semiconductor channel extending between a source region and a drain region, a plurality of pass gate electrodes, a plurality of word lines, a gate dielectric located between the semiconductor channel and the plurality of pass gate electrodes, and ferroelectric material portions located between the semiconductor channel and the plurality of word lines.

According to another embodiment of the present disclosure, a method of forming three-dimensional memory device is provided, which comprises: forming a vertically alternating sequence of insulating layers and electrically conductive layers over a substrate; forming line trenches laterally extending along a first horizontal direction through the vertically alternating sequence, wherein remaining portions of the vertically alternating sequence include alternating stacks of insulating strips and electrically conductive strips; forming a row of in-process memory pillar structures within each of the line trenches, wherein each of the in-process memory pillar structures comprises, from one side to another, a ferroelectric material layer, the interlayer dielectric layer, a sacrificial pillar portion, and a gate dielectric layer; forming channel cavities by removing the sacrificial pillar portions; and forming a semiconductor channel within each channel cavity on a respective pair of the interlayer dielectric layer and a gate dielectric layer.

According to yet another aspect of the present disclosure, a method of forming a memory device is formed, which comprises: forming pass gate electrodes embedded in a dielectric material layer over a substrate; forming a gate dielectric layer over the pass gate electrodes; forming a semiconductor channel, a source region, and a drain region over the gate dielectric layer; and forming interlayer dielectric portions, ferroelectric material portions, and word lines over the semiconductor channel.

According to still another aspect of the present disclosure, a three-dimensional memory device comprises a word line type stack of alternating first insulating strips and word lines located over a substrate, a pass gate type stack of alternating second insulating strips and pass gate electrodes located over the substrate, a vertical semiconductor channel located between the pass gate type stack and the word line type stack, a gate dielectric located between the vertical semiconductor channel and the pass gate type stack, and ferroelectric material portions located between the vertical semiconductor channel and the word line type stack.

BRIEF DESCRIPTION OF THE DRAWINGS

FIG. 1A is a vertical cross-sectional view of a first exemplary structure for forming a first ferroelectric memory device after formation of pass gate electrodes and a gate dielectric layer according to a first embodiment of the present disclosure.

FIG. 1B is a top-down view of the first exemplary structure of FIG. 1A.

FIG. 2A is a vertical cross-sectional view of the first exemplary structure after formation of a semiconductor channels, source regions, and drain regions according to the first embodiment of the present disclosure.

FIG. 2B is a top-down view of the first exemplary structure of FIG. 2A.

FIG. 3A is a vertical cross-sectional view of the first exemplary structure after formation of the interlayer dielectric layer, a ferroelectric material layer, and word lines according to the first embodiment of the present disclosure.

FIG. 3B is a top-down view of the first exemplary structure of FIG. 3A.

FIG. 4A is a vertical cross-sectional view of an alternative configuration of the first exemplary structure according to the first embodiment of the present disclosure.

FIG. 4B is a top-down view of the first exemplary structure of FIG. 4A.

FIG. 5A is a vertical cross-sectional view of a second exemplary structure after formation of a vertically alternating sequence of insulating layers and electrically conductive layers according to a second embodiment of the present disclosure.

FIG. 5B is a horizontal cross-sectional view of the second exemplary structure along the horizontal plane B-B' of FIG. 5A. The vertical plane A-A' is the plane of the vertical cross-sectional view of FIG. 5A.

FIG. 7A is a vertical cross-sectional view of the second exemplary structure after formation of a ferroelectric material layer according to the second embodiment of the present disclosure.

FIG. 7B is a horizontal cross-sectional view of the second exemplary structure along the horizontal plane B-B' of FIG. 7A. The vertical plane A-A' is the plane of the vertical cross-sectional view of FIG. 7A.

FIG. 9A is a vertical cross-sectional view of the second exemplary structure after deposition of a continuous dielectric material layer according to the second embodiment of the present disclosure.

FIG. 9B is a horizontal cross-sectional view of the second exemplary structure along the horizontal plane B-B' of FIG. 9A. The vertical plane A-A' is the plane of the vertical cross-sectional view of FIG. 9A.

FIG. 10A is a vertical cross-sectional view of the second exemplary structure after formation of a combination of a ferroelectric material layer, the interlayer dielectric layer, a sacrificial pillar rail, and a gate dielectric layer in each line trench according to the second embodiment of the present disclosure.

FIG. 10B is a horizontal cross-sectional view of the second exemplary structure along the horizontal plane B-B' of FIG. 10A. The vertical plane A-A' is the plane of the vertical cross-sectional view of FIG. 10A.

FIG. 11A is a vertical cross-sectional view of the second exemplary structure after formation of a laterally alternating sequence of in-process memory pillar structures and dielectric pillar structures in each line trench according to the second embodiment of the present disclosure.

FIG. 11B is a horizontal cross-sectional view of the second exemplary structure along the horizontal plane B-B' of FIG. 11A. The vertical plane A-A' is the plane of the vertical cross-sectional view of FIG. 11A.

FIG. 12A is a vertical cross-sectional view of the second exemplary structure after formation of channel cavities in each line trench according to the second embodiment of the present disclosure.

FIG. 12B is a horizontal cross-sectional view of the second exemplary structure along the horizontal plane B-B' of FIG. 12A. The vertical plane A-A' is the plane of the vertical cross-sectional view of FIG. 12A.

FIG. 13A is a vertical cross-sectional view of the second exemplary structure after formation of semiconductor channels, dielectric cores, and drain regions in the pillar cavities according to the second embodiment of the present disclosure.

FIG. 13B is a horizontal cross-sectional view of the second exemplary structure along the horizontal plane B-B' of FIG. 13A. The vertical plane A-A' is the plane of the vertical cross-sectional view of FIG. 13A.

FIG. 14A is a vertical cross-sectional view of a first configuration of a third exemplary structure including a three-dimensional array of ferroelectric memory elements according to a third embodiment of the present disclosure.

FIG. 14B is a horizontal cross-sectional view of the first configuration of the third exemplary structure along a horizontal plane B-B' of FIG. 14A. The vertical plane A-A' is a plane of the vertical cross-sectional view of FIG. 14A.

FIG. 14C is a vertical cross-sectional view of the first configuration of the third exemplary structure along the vertical plane C-C' of FIG. 14B. The horizontal plane B-B' is the plane of the horizontal cross-sectional view of FIG. 14B.

FIG. 14D is a horizontal cross-sectional view of the first configuration of the third exemplary structure along the horizontal plane D-D' of FIGS. 14A and 14C. The vertical plane A-A' is a plane of the vertical cross-sectional view of FIG. 14A. The vertical plane C-C' is a plane of the vertical cross-sectional view of FIG. 14C.

FIG. 15A is a vertical cross-sectional view of a second configuration of the third exemplary structure including a three-dimensional array of ferroelectric memory elements according to a third embodiment of the present disclosure.

FIG. 15B is a horizontal cross-sectional view of the second configuration of the third exemplary structure along a horizontal plane B-B' of FIG. 15A. The vertical plane A-A' is a plane of the vertical cross-sectional view of FIG. 15A.

FIG. 16A is a vertical cross-sectional view of a third configuration of a third exemplary structure including a three-dimensional array of ferroelectric memory elements according to a third embodiment of the present disclosure.

FIG. 16B is a horizontal cross-sectional view of the third configuration of the third exemplary structure along a horizontal plane B-B' of FIG. 16A. The vertical plane A-A' is a plane of the vertical cross-sectional view of FIG. 16A.

FIG. 16C is a vertical cross-sectional view of the third configuration of the third exemplary structure along the vertical plane C-C' of FIG. 16B. The horizontal plane B-B' is the plane of the horizontal cross-sectional view of FIG. 16B.

FIG. 18A is a vertical cross-sectional view of a second configuration of the fourth exemplary structure including a three-dimensional array of ferroelectric memory elements according to a fourth embodiment of the present disclosure.

FIG. 18B is a horizontal cross-sectional view of the second configuration of the fourth exemplary structure along a horizontal plane B-B' of FIG. 18A. The vertical plane A-A' is a plane of the vertical cross-sectional view of FIG. 18A.

FIG. 18C is a vertical cross-sectional view of the third configuration of the fourth exemplary structure including a three-dimensional array of ferroelectric memory elements according to the fourth embodiment of the present disclosure.

FIGS. 21B and 21C are tables illustrating exemplary voltages that may be used to operate the circuit of FIG. 21A.

DETAILED DESCRIPTION

Figure 6B:
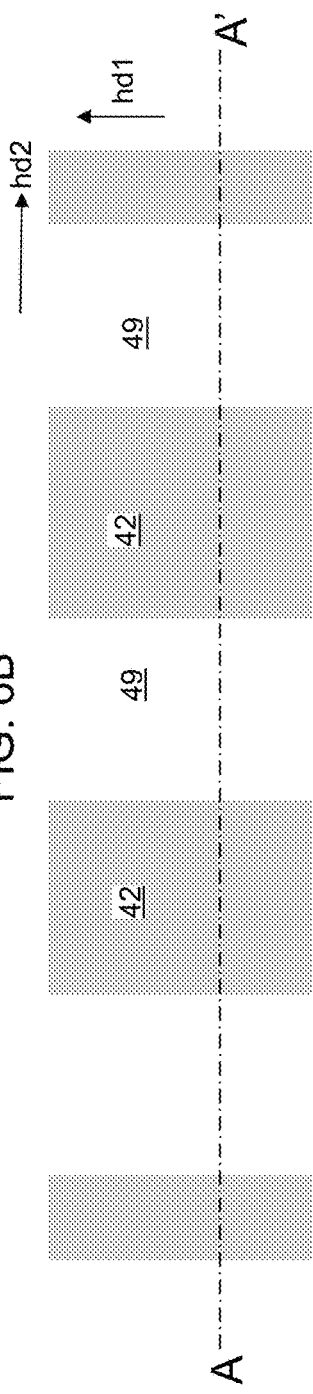
FIG. 6B is a horizontal cross-sectional view of the second exemplary structure along the horizontal plane B-B' of FIG. 6A. The vertical plane A-A' is the plane of the vertical cross-sectional view of FIG. 6A.

As discussed above, the embodiments of the present disclosure are directed to ferroelectric memory devices containing both word lines and pass gate electrodes and methods of manufacturing the same, the various aspect of which are described herein in detail. The pass gate electrodes decrease or eliminate the disturb between adjacent ferroelectric memory cells in the same memory string.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. As used herein, a first element located "on" a second element may be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

A monolithic three-dimensional memory array is a memory array in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and may be fabricated using the various embodiments described herein.

Referring to FIGS. 1A and 1B, a first exemplary structure for forming a first ferroelectric memory device according to a first embodiment of the present disclosure is illustrated. The first exemplary structure includes a substrate 109, which can be a semiconductor substrate, an insulating substrate, or a conductive substrate. For example, the substrate 109 can include a commercially available silicon wafer. In case the substrate 109 includes a semiconductor material or a conductive material, an insulating spacer layer 10 can be formed over the substrate 109 to provide electrical isolation for devices to be formed thereupon from the substrate 109. The insulating spacer layer 10 includes a dielectric material such as silicon oxide, silicon nitride, or a dielectric metal oxide. For example, the insulating spacer layer 10 can include undoped silicate glass or a doped silicate glass, and can have a thickness in a range from 10 nm to 500 nm, although lesser and greater thicknesses can also be employed.

A pass-gate-isolation dielectric layer 132 is deposited over the insulating spacer layer 10, and is patterned to form line trenches that laterally extend along a horizontal direction, which is herein referred to as a gate direction gd. The pass-gate-isolation dielectric layer 132 is an insulating material layer having a horizontal top surface. At least one conductive material can be deposited in the line trenches. The at least one conductive material can include at least one metallic material and/or at least one heavily-doped semiconductor material. For example, a combination of a conductive metallic nitride (such as TiN, TaN, or WN) and a conductive fill material (such as W, Co, Mo, Ru, Cu, etc.) can be deposited in the line trenches. Excess portions of the at least one conductive material can be removed from above the horizontal plane including the top surfaces of the remaining portions of the pass-gate-isolation dielectric layer 132. Remaining portions of the at least one conductive material in the line trenches include pass gate electrodes 36. As used herein, a "pass gate electrode" refers to an electrode, such as a back gate electrode, that is used to control a flow of electrical current through a semiconductor channel irrespective of a voltage applied to a word line located adjacent to the semiconductor channel. Select gate electrodes (26, 66) can be formed in addition to the pass gate electrodes 36. As used herein, a "select gate electrode" refers to an electrode that can enable, or disable, electrical current through a semiconductor channel. The select gate electrodes (26, 66) can include a source-side select gate electrode 26 that is formed on one side of the pass gate electrodes 36 and a drain-side select gate electrode 66 that is formed on another side of the pass gate electrodes 66.

Alternatively, the select gate electrodes (26, 66) and the pass gate electrodes 36 can be formed prior to forming the pass-gate-isolation dielectric layer 132. An electrically conductive layer can be formed and patterned to form the rail shaped select gate electrodes (26, 66) and the pass gate electrodes 36. A dielectric material is then formed over and between the electrodes, and planarized to remove the dielectric material from above the electrodes to form the pass-gate-isolation dielectric layer 132 located between the electrodes (26, 66, 36).

A gate dielectric layer 52 can be deposited on the top surfaces of the pass gate electrodes 36, the select gate electrodes (26, 66), and the pass-gate-isolation dielectric layer 132. The gate dielectric layer 52 includes a gate dielectric layer material such as silicon oxide and/or a dielectric metal oxide.

Referring to FIGS. 2A and 2B, a semiconductor material can be deposited over the gate dielectric layer 52, and can be patterned into strips that laterally extend along a channel direction cd, which can be perpendicular to the gate direction gd. The semiconductor material can include, for example, silicon (e.g., amorphous silicon or polysilicon), a silicon-germanium alloy, or a compound semiconductor material. The semiconductor material can have a doping of a first conductivity type, which may be p-type or n-type. Atomic concentration of electrical dopants of the first conductivity type in the semiconductor material can be in a range from $1.0 \times 10^{15}/cm^3$ to $1.0 \times 10^{18}/cm^3$, although lesser and greater atomic concentrations can also be employed. The thickness of the patterned semiconductor material strips can be in a range from 3 nm to 60 nm, such as from 6 nm to 30 nm, although lesser and greater thicknesses can also be employed. The patterned semiconductor material strips are laterally spaced apart by line trenches that laterally extend along the channel direction cd.

A source region 28 and a drain region 68 can be formed on or in opposite ends of the semiconductor material strips. The source and drain regions can comprise respective source and drain lines or discrete doped semiconductor regions that are electrically connected to respective source and drain lines. For example, dopants of a second conductivity can be implanted into end portions of the semiconductor material strips employing a masked ion implantation process. The implanted portions of the patterned semiconductor material strips can be located outside the areas including the pass gate electrodes 36 and the select gate electrodes (26, 66). The source region 28 can be formed in each implanted portion of the semiconductor material strips that is adjacent to a source-side select gate electrode 26, and the drain region 68 can be formed in each implanted portion of the semiconductor material strips that is adjacent to a drain-side select gate electrode 66. Each continuous portion of the semiconductor material strip that extends between a source region 28 and a drain region 68 constitutes a semiconductor channel 160. The atomic concentration of dopants of the second conductivity type in the source regions 28 and the drain regions 68 can be in a range from $5.0 \times 10^{18}/cm^3$ to $2.0 \times 10^{21}/cm^3$, although lesser and greater atomic concentrations can also be employed.

A dielectric material such as silicon oxide is deposited in the line trenches. Excess portions of the dielectric material overlying a horizontal plane including the top surfaces of the semiconductor channels 160 are removed by a planarization process. The planarization process can employ a recess etch and/or chemical mechanical planarization. The remaining portions of the deposited dielectric material constitutes a channel-isolation dielectric layer 162, which can include multiple strips that laterally extend along the channel direction cd and a matrix portion that laterally surrounds the entire area including the semiconductor channels 160, the source regions 28, and the drain regions 68.

Alternatively, the channel-isolation dielectric layer 162 can be formed first by depositing a dielectric material and patterning the dielectric material into rail shaped portions of the channel-isolation dielectric layer 162. The semiconductor channels 160 are then formed by depositing a semiconductor material in between and over the rail shaped portions of the channel-isolation dielectric layer 162 and planarizing the semiconductor material to leave the rail shaped semiconductor channels 160 between the rail shaped portions of the channel-isolation dielectric layer 162.

Referring to FIGS. 3A and 3B, an interlayer (e.g., barrier) dielectric layer 156, a ferroelectric material layer 154L, and at least one electrically conductive material layer can be sequentially deposited over the semiconductor channels 160 and the channel-isolation dielectric layer 162. The interlayer dielectric layer 156 includes a dielectric material such as silicon oxide, silicon nitride, or a dielectric metal oxide. The thickness of the interlayer dielectric layer 156 can be in a range from 0.5 nm to 6 nm, such as from 1 nm to 3 nm, although lesser and greater thicknesses can also be employed.

The ferroelectric material layer 154L includes a ferroelectric material. As used herein, a "ferroelectric material" refers to a crystalline material that exhibits spontaneous electrical polarization in the absence of an external electric field. The ferroelectric material in the ferroelectric material layer 154L may be an insulating ferroelectric material. In one embodiment, the ferroelectric material layer 154L comprises an orthorhombic phase hafnium oxide layer including at least one dopant selected from Al, Zr, and/or Si. Other suitable ferroelectric materials may also be used, as such as titanate ferroelectric materials (e.g., barium titanate, lead titanate, lead zirconate titanate, lead lanthanum zirconate titanate ("PLZT"), etc.). The ferroelectric material layer 154L can have a thickness in a range from 3 nm to 60 nm, such as from 6 nm to 30 nm, although lesser and greater thicknesses can also be employed. In one embodiment, the ferroelectric material layer 154L can be deposited by a conformal deposition process such as chemical vapor deposition (CVD) or atomic layer deposition (ALD).

The at least one conductive material can include at least one metallic material and/or at least one heavily doped semiconductor material. In one embodiment, the at least one conductive material can include a layer stack of a conductive metallic nitride barrier layer including a conductive metallic nitride material (such as TiN, TaN, and/or WN) and a metal layer including a metal (such as W, Mo, Cu, Co, Ru, etc.). The at least one conductive material can be patterned into strip shapes that extend in direction gd and overlie the semiconductor channels 160. Each patterned strip of the at least one conductive material constitutes a word line 46, which is a control gate electrode for each of the underlying semiconductor channels 160. In one embodiment, each word line 46 overlies a respective one of the pass gate electrodes 36. In another embodiment, the word lines and pass gate electrodes may be laterally offset from each other.

A dielectric material can be deposited around the word lines 46 and can be planarized to provide a word-line-isolation dielectric layer 142. Alternatively, the word-line-isolation dielectric layer 142 may be formed and patterned prior to forming the word lines 46, and the word lines 46 are formed by a damascene process in openings in the word-line-isolation dielectric layer 142. A stack of the interlayer dielectric portion and a ferroelectric material portion can be formed between each word line 46 and each of the semiconductor channels 160. Each interlayer dielectric portion comprises a portion of the interlayer dielectric layer 156. Each ferroelectric material portion is a portion of the ferroelectric material layer 154L. Thus, the interlayer dielectric portions are formed as portions of the interlayer dielectric layer 156, and underlie a respective one of the word lines 46. The ferroelectric material portions are formed as portions of the ferroelectric material layer 154L, and underlie a respective one of the word lines 46.

Referring to FIGS. 4A and 4B, an alternative configuration of the first exemplary structure according to the first embodiment of the present disclosure is illustrated. In this configuration, an anisotropic etch process can be employed to etch through the at least one conductive material and the ferroelectric material layer 154L at a processing step of FIGS. 3A and 3B that is employed to pattern the at least one conductive material. In other words, the ferroelectric material layer 154L is patterned employing a same etch mask that is employed to pattern the at least one electrically conductive material into the word lines 46. The ferroelectric material layer 154L is patterned into ferroelectric material portions 154 having a same horizontal cross-sectional shape as an overlying one of the word lines 46.

Generally, a layer stack of a ferroelectric material layer 154L and at least one conductive material layer can be formed over the interlayer dielectric layer 156. The layer stack can be patterned into discrete material stacks employing an anisotropic etch process. Each of the discrete material stacks can comprise a patterned portion of the ferroelectric material layer 154L that constitute one of the ferroelectric material portions 154, and a patterned portion of the at least one conductive material layer that constitutes one of the word lines 46.

Referring to FIGS. 1A, 1B, 2A, 2B, 3A, 3B, 4A, and 4B, each combination of a semiconductor channel 160 and adjacent portions of the word lines 46, the pass gate electrodes 36, the select gate electrodes (26, 66), the gate dielectric layer 52, and the interlayer dielectric layer 156 constitutes a ferroelectric memory string, in which data can be stored in the form of the direction of ferroelectric polarization in the ferroelectric material portions located between the semiconductor channel 160 and the word lines 46. The ferroelectric polarization of each ferroelectric material portion may point toward, or point away from, the semiconductor channel 160.

A memory device comprising at least one ferroelectric memory string is provided. Each of the at least one ferroelectric memory string comprises: a semiconductor channel 160 extending between a source region 28 and a drain region 68; a gate dielectric layer 52 located on a first lengthwise surface (such as a bottom surface) of the semiconductor channel 160 that extends between the source region 28 and the drain region 68, for example, along the channel direction cd; pass gate electrodes 36 located on the gate dielectric layer 52 and extending between the source region 28 and the drain region 68; and word lines 46 located over a second lengthwise surface (such as the top surface) of the semiconductor channel 160 between the source region 28 and the drain region 68, wherein the second lengthwise surface is located on an opposite side of the first lengthwise surface, and each of the word lines 46 is spaced from the second lengthwise surface by a respective ferroelectric material portion (154L or 154) and a respective interlayer dielectric portion, i.e., portions of the interlayer dielectric layer 156.

In one embodiment, the interlayer dielectric portions within each of the at least one ferroelectric memory string comprises portions of the interlayer dielectric layer 156 that extends across each of the word lines 46.

In one embodiment, ferroelectric material portions within each of the at least one ferroelectric memory string comprises portions of a ferroelectric material layer 154L that extends from a region that overlies the source region 28 to a region that overlies the drain region 68.

In one embodiment, ferroelectric material portions within each of the at least one ferroelectric memory string comprises discrete ferroelectric material portions 154 that are spaced among from each other by intervening dielectric material portions (such as portions of the word-line-isolation dielectric layer 142).

In one embodiment, each of the at least one ferroelectric memory string is located over an insulating material layer 10 having a horizontal top surface. The first lengthwise surface and the second lengthwise surface are parallel to the horizontal top surface of the insulating material layer 10.

Referring to FIGS. 5A and 5B, a second exemplary structure for forming a second ferroelectric memory device according to a second embodiment of the present disclosure is illustrated. A vertically alternating sequence (32L, 42L) of insulating layers 32L and sacrificial layers 42L can be formed over a substrate including a substrate semiconductor layer 9. The substrate semiconductor layer 9 may comprise single crystalline silicon have a doping of a first conductivity type (e.g., p-type). The dopants may comprise a well in a single crystalline silicon wafer (i.e., a well in the substrate semiconductor layer 9) or background doping the wafer. Atomic concentration of dopants of the first conductivity type in the substrate semiconductor layer 9 can be in a range from $1.0 \times 10^{15}/cm^3$ to $3.0 \times 10^{18}/cm^3$, although lesser and greater atomic concentrations can also be employed. Source regions 28 (e.g., portions of a doped source line or a doped region located in electrical contact with a source line) can be formed in an upper portion of the substrate semiconductor layer 9. The source regions 28 have a doping of a second conductivity type (e.g., n-type), which is the opposite of the first conductivity type. The atomic concentration of dopants of the second conductivity type in the source region within the substrate semiconductor layer 9 can be in a range from $5.0 \times 10^{19}/cm^3$ to $2.0 \times 10^{21}/cm^3$, although lesser and greater atomic concentrations can also be employed.

Insulating materials that can be employed for the insulating layers 32L include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the insulating layers 32L can include silicon oxide. The sacrificial layers 42L may be formed of any suitable a sacrificial material that is removed selective to the first material of the insulating layers 32L. The sacrificial layers 42L may comprise an insulating material, such as silicon nitride, or a semiconductor material, such as amorphous silicon or polysilicon, if the insulating layers 32L comprise silicon oxide.

Each of the insulating layers 32L and the sacrificial layers 42L can be deposited, for example, by chemical vapor deposition (CVD). Each of the insulating layers 32L and the sacrificial layers 42L can have a thickness in a range from 20 nm to 50 nm, although lesser and greater thicknesses can be also be employed. In one embodiment, each of the insulating layers 32L can have a first thickness, and each of the sacrificial layers 42L can have a second thickness. In one embodiment, a topmost one of the insulating layers 32L may have a greater thickness than underlying insulating layers 32L. A combination of an insulating layer 32L and a sacrificial layer 42L constitutes a repetition unit that is repeated multiple times along the vertical direction. The total number of repetitions of the repetition unit may be in a range from 8 to 1,024, such as from 32 to 256, although lesser and greater number of repetitions can also be employed.

Figure 6A:
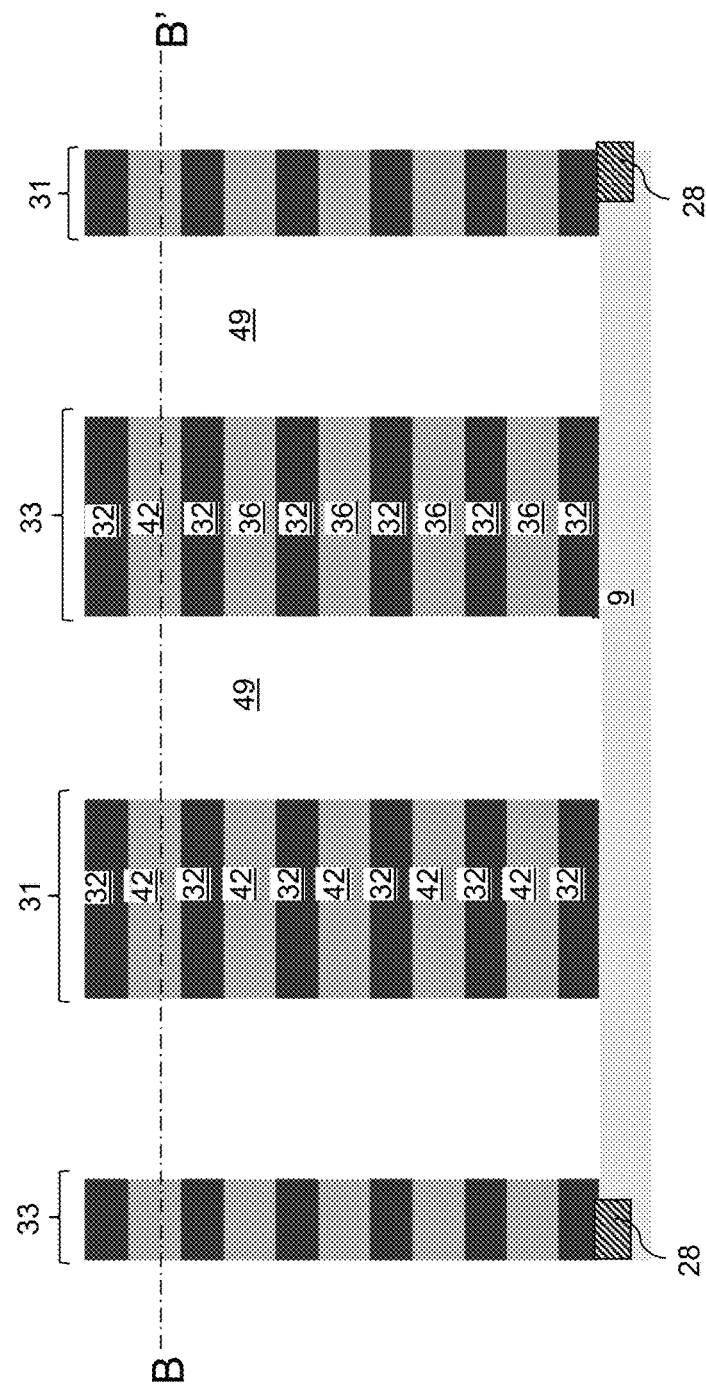
FIG. 6A is a vertical cross-sectional view of the second exemplary structure after formation of line trenches and vertically alternating stacks of insulating strips and electrically conductive strips according to the second embodiment of the present disclosure.

Referring to FIGS. 6A and 6B, a photoresist layer can be applied over the topmost insulating layer 32L, and can be lithographically patterned to form a line and space pattern that laterally extends along a first horizontal direction hd1. The line and space pattern can be transferred through the vertically alternating sequence (32L, 42L) to divide the vertically alternating sequence (32L, 42L) into multiple disjoined portions that are laterally spaced from each other by line trenches 49 that laterally extend along the first horizontal direction hd1, and are laterally spaced apart along a second horizontal direction hd2 that is perpendicular to the first horizontal direction hd1. The anisotropic etch process can stop on the top surface of the substrate semiconductor layer 9. The photoresist layer can be subsequently removed, for example, by ashing.

Patterned portions of the insulating layers 32L include insulating strips 32. Patterned portions of the sacrificial layers 42L include sacrificial strips 42. The remaining portions of the vertically alternating sequence (32L, 42L) include word line type stacks 31 and pass gate type stacks 33 of insulating strips 32 and sacrificial strips 42. The word line type stacks 31 and the pass gate type stacks 33 can laterally alternate along the second horizontal direction hd2. Each neighboring pair of a word line type stack 31 and a pass gate type stack 33 can be laterally spaced apart by a respective line trench 49.

The width of each word line type stack 31 along the second horizontal direction hd2 can be in a range from 20 nm to 200 nm, although lesser and greater widths can also be employed. The width of each pass gate type stack 33 of insulating strips 32 and pass gate electrodes 36 along the second horizontal direction hd2 can be in a range from 20 nm to 200 nm, although lesser and greater widths can also be employed. The width of each line trench 49 can be in a range from 20 nm to 200 nm, although lesser and greater widths can also be employed.

Referring to FIGS. 7A and 7B, a continuous ferroelectric material layer 54L can be formed on the physically exposed surfaces of the alternating stacks (31, 33) and the substrate semiconductor layer 9 by a conformal deposition such as chemical vapor deposition or atomic layer deposition. The continuous ferroelectric material layer 54L may comprise an insulating ferroelectric material. In one embodiment, the continuous ferroelectric material layer 54L comprises an orthorhombic phase hafnium oxide layer including at least one dopant selected from Al, Zr, and/or Si. Other suitable ferroelectric materials may also be used, as such as titanate ferroelectric materials (e.g., barium titanate, lead titanate, lead zirconate titanate, lead lanthanum zirconate titanate ("PLZT"), etc.). The continuous ferroelectric material layer 54L can have a thickness in a range from 3 nm to 60 nm, such as from 6 nm to 30 nm, although lesser and greater thicknesses can also be employed.

Figure 8B:
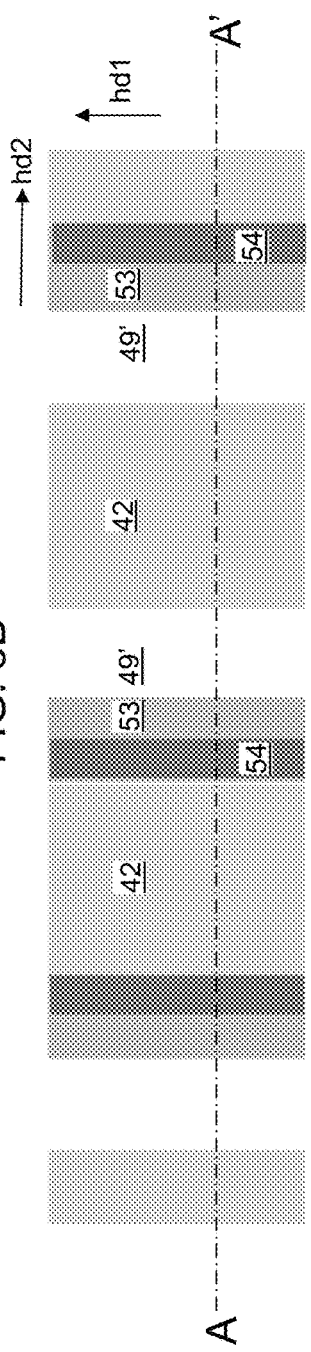
FIG. 8B is a horizontal cross-sectional view of the second exemplary structure along the horizontal plane B-B' of FIG. 8A. The vertical plane A-A' is the plane of the vertical cross-sectional view of FIG. 8A.
Figure 8A:
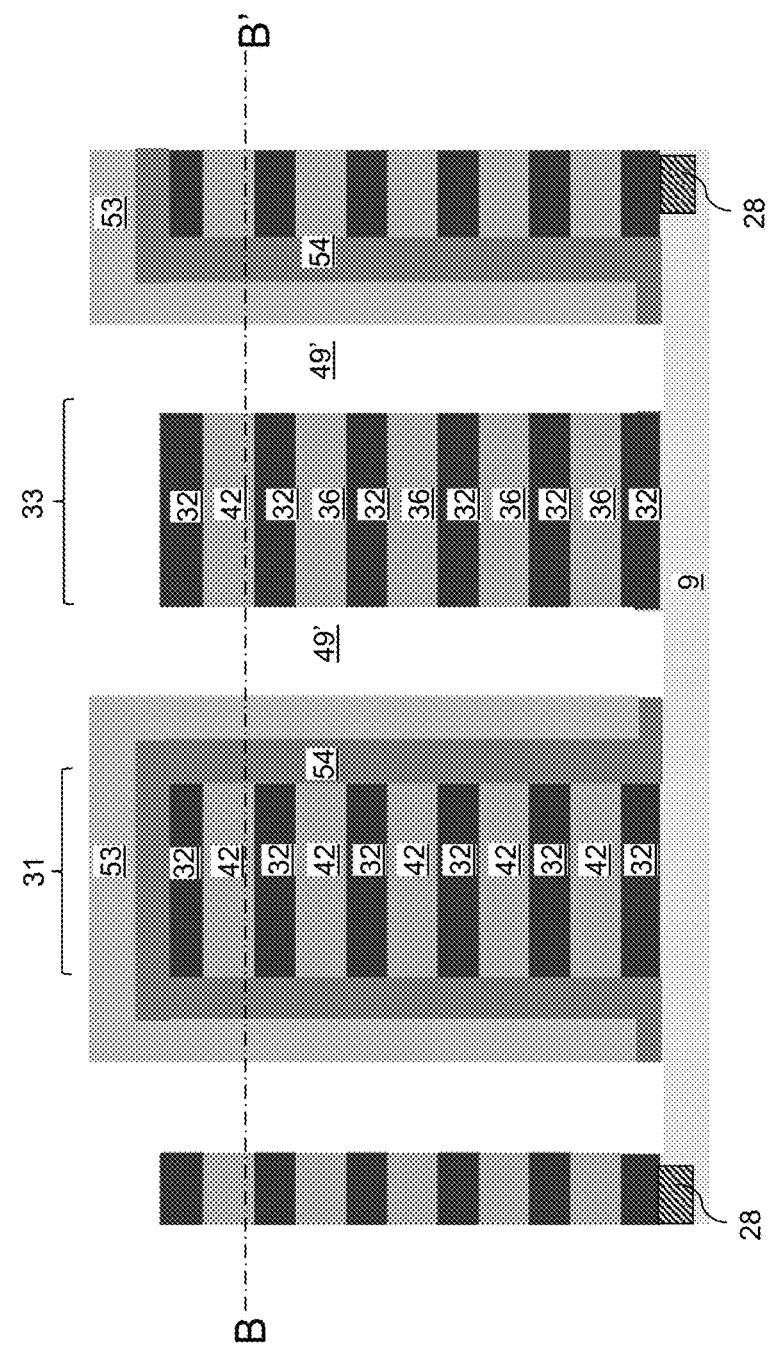
FIG. 8A is a vertical cross-sectional view of the second exemplary structure after patterning the ferroelectric material layer into multiple portions according to the second embodiment of the present disclosure.

Referring to FIGS. 8A and 8B, volumes of the line trenches 49 are partially filled with a masking material layer 53, which covers the continuous ferroelectric material layer 54L. The masking material layer 53 can include a material that can function as an etch mask. For example, the masking material layer 53 can include a hard mask material such as borosilicate glass, carbon or amorphous silicon.

The masking material layer 53 can be patterned such that patterned portions of the masking material layer 53 cover each word line type stack 31 but not the pass gate type stacks 33. Thus, the masking material layer 53 cover a first lengthwise sidewall of each line trench 49 (i.e., the sidewalls of each word line type stack 31), but does not cover a second lengthwise sidewall of each line trench 49 (i.e., the sidewalls of each pass gate type stack 33). In other words, the patterned masking material layer 53 covers one of a pair of lengthwise sidewalls of each line trench 49 and does not cover another of the pair of lengthwise sidewalls of each line trench 49. As used herein, a "lengthwise sidewall" refers to a sidewall that laterally extends along a lengthwise direction of a line trench 49.

For example, a photoresist layer (not shown) can be applied over the masking material layer and can be lithographically patterned. The pattern of the photoresist layer can be subsequently transferred through the masking material layer 53 by an anisotropic etch. The photoresist layer can be subsequently removed, for example, by ashing. Unmasked portions of the continuous ferroelectric material layer 54L can be removed by the etch process. The continuous ferroelectric material layer 54L is divided into multiple ferroelectric material layers 54 that are laterally spaced apart along the second horizontal direction hd2. Each ferroelectric material layer 54 covers each word line type stack 31 but does not cover each pass gate type stack 33. A first lengthwise sidewall of each line trench 49 contacts a respective one of the ferroelectric material layers 54L, and a second lengthwise sidewall of each line trench 49 does not contact any of the ferroelectric material layers 54. A line cavity 49' laterally extending along the first horizontal direction hd1 is present in each line trench 49. Each second lengthwise sidewall of the line trenches 49 is physically exposed to a respective one of the line cavities 49'.

Referring to FIGS. 9A and 9B, portions of the masking material layer 53 and the ferroelectric material layers 54 that overlie the horizontal plane including the top surfaces of the topmost insulating strips 32 can be removed, for example, by a planarization process such as chemical mechanical planarization. A ferroelectric material layer 54 may be divided into a pair of ferroelectric material layers 54 located on sidewalls of each word line type stack 31. Subsequently, remaining portions of the masking material layer 53 can be removed selective to the ferroelectric material layers 54, the alternating stacks (31, 33), and the substrate semiconductor layer 9. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

A continuous dielectric material layer 56L can be deposited on the physically exposed surfaces of the ferroelectric material layers 54, the substrate semiconductor layer 9, and the alternating stacks (31, 33). The continuous dielectric material layer 56L includes a dielectric material such as silicon oxide, silicon nitride, or a dielectric metal oxide. The thickness of the continuous dielectric material layer 56L can be in a range from 0.5 nm to 6 nm, such as from 1 nm to 3 nm, although lesser and greater thicknesses can also be employed. A line cavity 49' is present within each line trench 49.

Referring to FIGS. 10A and 10B, an anisotropic etch process can be performed to remove horizontal portions of the continuous dielectric material layer 56L. Each remaining vertical portion of the continuous dielectric material layer 56L contacting a ferroelectric material layer 54 constitutes the interlayer dielectric layer 56. Each remaining vertical portion of the continuous dielectric material layer 56L contacting a sidewall of an alternating stack (31, 33) constitutes a gate dielectric layer 52.

Subsequently, a sacrificial fill material can be deposited in each of the line cavities 49'. The sacrificial fill material includes a material that can be removed selective to the materials of the gate dielectric layers 52, the interlayer dielectric layers 56, the insulating strips 32, and the substrate semiconductor layer 9. For example, the sacrificial fill material can include amorphous carbon, diamond-like carbon (DLC), a silicon-germanium alloy, amorphous silicon, or a polymer material. Portions of the sacrificial fill material that overlie the horizontal plane including the topmost surfaces of the alternating stacks (31, 33) can be removed by a planarization process such as chemical mechanical planarization and/or a recess etch. Each remaining portion of the sacrificial fill material constitutes a sacrificial pillar rail 67R.

A contiguous set of material portions that fills a line trench 49 constitutes a line trench fill assembly (67R, 52, 56, 54). Each line trench fill assembly (67R, 52, 56, 54) includes a sacrificial pillar rail 67R, a gate dielectric layers 52, the interlayer dielectric layers 56, and a ferroelectric material layer 54.

Referring to FIGS. 11A and 11B, a first photoresist layer can be optionally applied over the alternating stacks (31, 33) and the line trench fill assemblies (67R, 52, 56, 54), and can be lithographically patterned to form linear openings that extend along the first horizontal direction and overlying a respective one of the alternating stacks (31, 33). Each linear opening in the photoresist layer can overlie a middle portion of a respective one of the word line type stacks 31. An anisotropic etch process can be performed to transfer the pattern of the linear openings in the first photoresist layer through the topmost insulating strips 32 and the sacrificial strips 42. The first photoresist layer can be subsequently removed, for example, by ashing.

A second photoresist layer can be applied over the topmost insulating strips 32 and the line trench fill assemblies (67R, 52, 56, 54), and can be lithographically patterned to form a two-dimensional array of discrete openings. The two-dimensional array of discrete openings can include multiple rows of discrete openings. Each row of discrete openings laterally extends along the first horizontal direction hd1, and overlies a respective one of the line trench fill assemblies (67R, 52, 56, 54). In one embodiment, each discrete opening in the second photoresist layer can include a pair of straight edges that are parallel to the second horizontal direction hd2, and extends across an entire width of a respective underlying line trench fill assembly (67R, 52, 56, 54) along the second horizontal direction hd2. In one embodiment, each discrete opening in the second photoresist layer can have a rectangular shape.

An anisotropic etch process is performed to transfer the pattern of the discrete openings in the second photoresist layer through the line trench fill assemblies (67R, 52, 56, 54). A two-dimensional array of rectangular pillar cavities can be formed in the volumes from which etched portions of the line trench fill assemblies (67R, 52, 56, 54) are removed. Each rectangular pillar cavity can vertically extend through the entire height of the line trench fill assemblies (67R, 52, 56, 54), and a top surface of the substrate semiconductor layer 9 can be physically exposed at the bottom of each rectangular pillar cavity. Each line trench fill assembly (67R, 52, 56, 54) can be divided into multiple disjoined portions that are laterally spaced apart along the first horizontal direction hd1. Each of the multiple disjoined portions constitutes an in-process memory pillar structure (67, 52, 56, 54). The second photoresist layer can be removed, for example, by ashing.

Each of the in-process memory pillar structures (67, 52, 56, 54) comprises, from one side to another, a ferroelectric material layer 54, the interlayer dielectric layer 56, a sacrificial pillar portion 67, and a gate dielectric layer 52. Each ferroelectric material layer 54 in an in-process memory pillar structures (67, 52, 56, 54) is a patterned portion of a ferroelectric material layer 54 in a respective line trench fill assembly (67R, 52, 56, 54). Each interlayer dielectric layer 56 in an in-process memory pillar structures (67, 52, 56, 54) is a patterned portion of the interlayer dielectric layer 56 in a respective line trench fill assembly (67R, 52, 56, 54).

Each sacrificial pillar portion 67 in an in-process memory pillar structures (67, 52, 56, 54) is a patterned portion of a sacrificial pillar rail 67R in a respective line trench fill assembly (67R, 52, 56, 54). Each gate dielectric layer 52 in an in-process memory pillar structures (67, 52, 56, 54) is a patterned portion of a gate dielectric layer 52 in a respective line trench fill assembly (67R, 52, 56, 54). Each in-process memory pillar structure (67, 52, 56, 54) can have a pair of straight sidewalls extending along the second horizontal direction. Each component of an in-process memory pillar structure (67, 52, 56, 54) can have a uniform width along the first horizontal direction hd1, which is the width of the respective in-process memory pillar structure (67, 52, 56, 54).

A dielectric material such as silicon oxide can be conformally deposited within the rectangular pillar cavities located between each laterally neighboring pair of in-process memory pillar structures (67, 52, 56, 54) and within line trenches that separate the alternating stacks (31, 33). Excess portions of the dielectric material can be removed from above the horizontal plane including the topmost surfaces of the topmost insulating strips 32. Each remaining portion of the dielectric material filling a respective rectangular pillar cavity constitutes a dielectric pillar structure 64. Each remaining portion of the dielectric material filling a respective line trench constitutes a drain-select-level dielectric isolation structure 72.

In one embodiment, a respective dielectric pillar structure 64 is formed between each laterally neighboring pair of in-process memory pillar structures (67, 52, 56, 54) within each of the line trenches 49. A row of dielectric pillar structures 64 is formed within each line trench 49. The row of dielectric pillar structures 64 is interlaced with a row of in-process memory pillar structures (67, 52, 56, 54) within each line trench 49. Thus, a laterally alternating sequence of in-process memory pillar structures (67, 52, 56, 54) and dielectric pillar structures 64 is formed in each line trench 49.

Referring to FIGS. 12A and 12B, the sacrificial pillar portions 67 can be removed selective to the materials of the gate dielectric layers 52, the interlayer dielectric layers 56, the substrate semiconductor layer 9, and the dielectric pillar structures 64. A channel cavity 69 is formed within each volume from which a sacrificial pillar portion 67 is removed. A top surface of the substrate semiconductor layer 9 can be physically exposed at the bottom of each channel cavity 69. A gate dielectric layer 52 is physically exposed on one side of each channel cavity 69, and the interlayer dielectric layer 56 is physically exposed on an opposite side of each channel cavity 69. Sidewalls of a pair of dielectric pillar structures 64 can be physically exposed to a channel cavity 69.

Referring to FIGS. 13A and 13B, a semiconductor material having a doping of the first conductivity type can be deposited in the channel cavities 69 by a conformal deposition process. The semiconductor material may be selected from at least one elemental semiconductor material, at least one III-V compound semiconductor material, at least one II-VI compound semiconductor material, at least one organic semiconductor material, or other semiconductor materials known in the art. In one embodiment, the conformally deposited semiconductor material includes amorphous silicon or polysilicon. Atomic concentration of electrical dopants of the first conductivity type in the semiconductor material can be in a range from $1.0 \times 10^{15}/cm^3$ to $1.0 \times 10^{18}/cm^3$, although lesser and greater atomic concentrations can also be employed. The semiconductor material may be deposited by a conformal deposition method such as low pressure chemical vapor deposition (LPCVD). The thickness of the deposited semiconductor material may be in a range from 2 nm to 20 nm, although lesser and greater thicknesses may also be used. An optional unfilled volume may be present within each channel cavity 69 after deposition of the semiconductor material.

A dielectric fill material such as silicon oxide can be deposited in the unfilled volumes of the channel cavities 69. Excess portions of the deposited semiconductor material and the dielectric fill material overlying the horizontal plane including the top surfaces of the topmost insulating strips 32 can be removed by a planarization process. For example, a first recess etch process can vertically recess the dielectric fill material to a height below the horizontal plane including the top surfaces of the topmost insulating strips 32. The first recess etch process can etch the dielectric fill material selective to the underlying semiconductor material. Each remaining portion of the dielectric fill material in the channel cavities 69 constitutes a dielectric core 62. Horizontal portions of the semiconductor material overlying the horizontal plane including the top surfaces of the topmost insulating strips 32 can be removed by a second recess etch process. The second recess etch process can etch the semiconductor material selective to the materials of the insulating strips 32 and the dielectric cores 62. Each remaining portion of the semiconductor material in the channel cavities 69 constitutes a vertical semiconductor channel 60. Each vertical semiconductor channel 60 is formed within a respective channel cavity 69 on a respective pair of the interlayer dielectric layer 56 and a gate dielectric layer 52.

Drain regions 68 may be formed by depositing a doped semiconductor material within each recessed region above the dielectric cores 62. The drain regions 68 may have a doping of a second conductivity type that is the opposite of the first conductivity type. For example, if the first conductivity type is p-type, the second conductivity type is n-type, and vice versa. The dopant concentration in the drain regions 68 may be in a range from $5.0 \times 10^{18}/cm^3$ to $2.0 \times 10^{21}/cm^3$, although lesser and greater dopant concentrations may also be used. The doped semiconductor material may be, for example, doped polysilicon. Excess portions of the deposited semiconductor material may be removed from above the top surface of the topmost insulating strips 32, for example, by chemical mechanical planarization (CMP) or a recess etch to form the drain regions 68. In one embodiment, surface portions of the substrate semiconductor layer 9 extending between the bottom ends of the vertical semiconductor channels 60 and the source regions 28 constitute horizontal semiconductor channels 59. In this case, each semiconductor channel (59, 60) can include a vertical semiconductor channel 60 and a horizontal semiconductor channel 59. Alternatively, the source regions 28 can be configured such that a bottom end of each vertical semiconductor channel 60 contacts a respective one of the source regions 28. In this case, each semiconductor channel 60 can consist of a vertical semiconductor channel 60.

A memory pillar structure (54, 56, 60, 62, 68, 52) can be formed between each laterally neighboring pair of dielectric pillar structures 64 within each line trench 49. Each memory pillar structure (54, 56, 60, 62, 68, 52) can include a ferroelectric material layer 54, the interlayer dielectric layer 56, a vertical semiconductor channel 60, a dielectric core 62, and a gate dielectric layer 52.

Subsequently, openings, such as trenches or vias, are formed through the structure to expose the sacrificial strips 42. The sacrificial strips 42 are removed through the openings by selective etching to form horizontal recesses between the insulating strips 32. An electrically conductive material is deposited through the openings into the recesses. The electrically conductive material may comprise an electrically conductive metal nitride barrier material, such as TiN, WN or TN, and/or a metal fill material, such as W, Al, Cu, Ru, Ti, Mo and/or alloys thereof. The electrically conductive material is then removed from the openings by anisotropic etching to leave various electrodes and lines in the recesses.

Figure 13D:
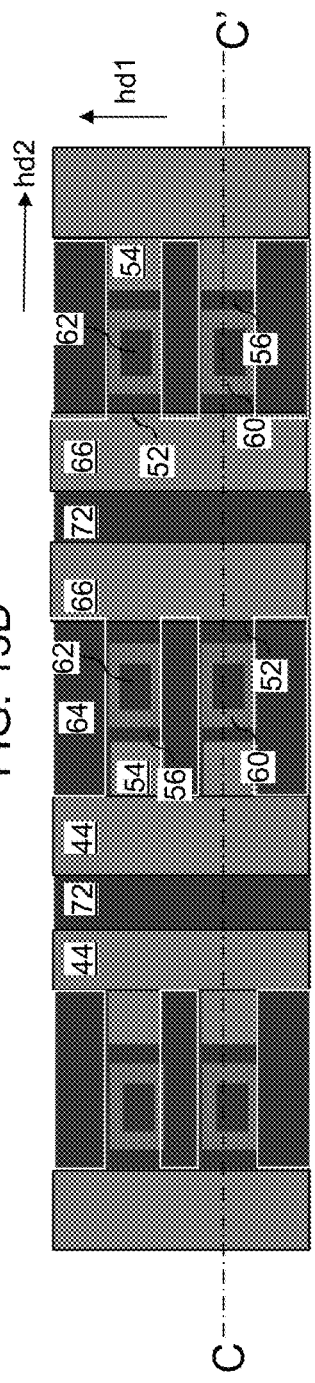
FIG. 13D is a horizontal cross-sectional view of the second exemplary structure along the horizontal plane D-D' of FIG. 13C. The vertical plane C-C' is the plane of the vertical cross-sectional view of FIG. 13C.
Figure 13C:
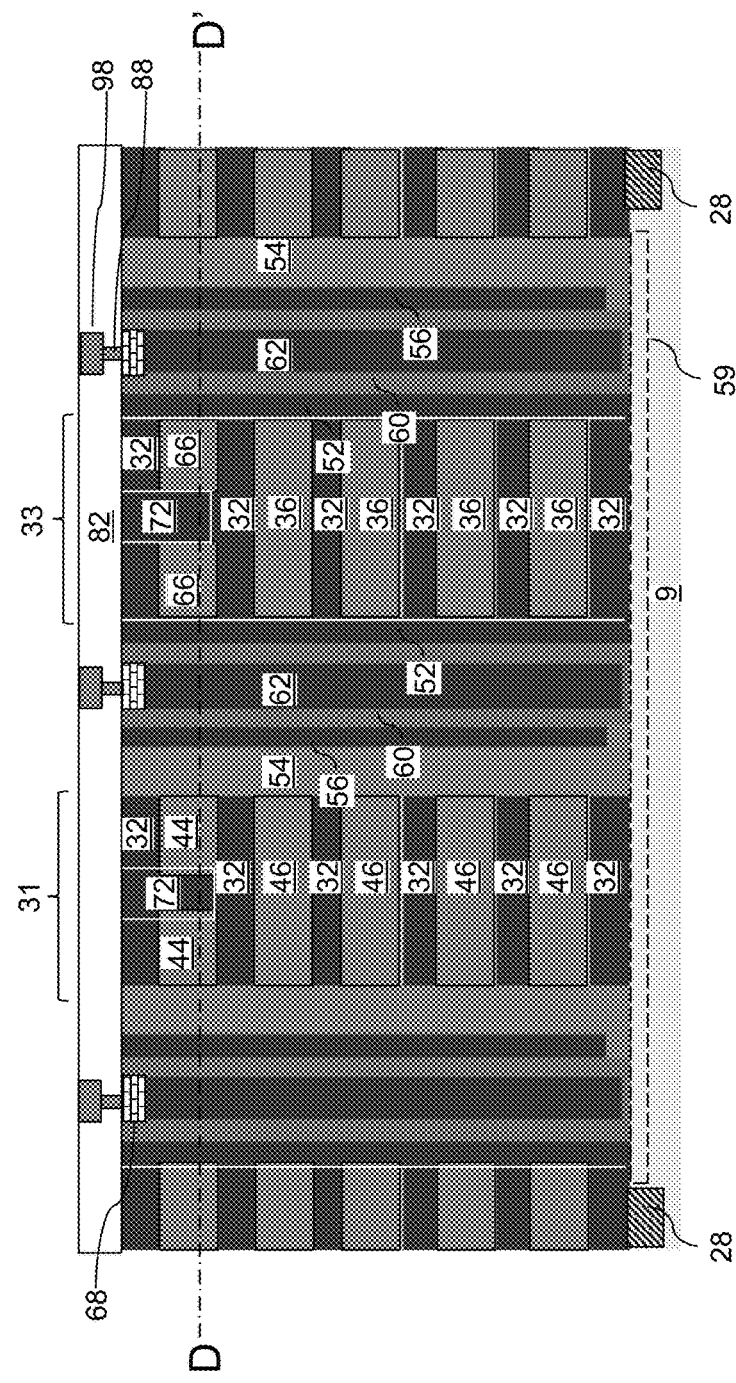
FIG. 13C is a vertical cross-sectional view of the second exemplary structure after formation of word lines, pass gates and bit lines according to the second embodiment of the present disclosure.

As shown in FIGS. 13C and 13D, the electrodes and lines include word lines 46, pass gate electrodes 36, and two types of drain-side select gate electrodes (44, 66). The word lines 46 and first type drain-side select gate electrodes 44 are located in the word line type stacks 31. The pass gate electrodes 36 and the second type drain-side select gate electrodes 66 are located in the pass gate type stacks 33. The respective drain-side select gate electrodes (44, 66) overly the respective word lines 46 and pass gate electrodes 36 in their respective alternating stacks (31, 33). Each of the drain-side select gate electrodes (44, 66) functions as a select gate electrode that selects or deselects a vertical semiconductor channel 60 for programming, erasing or reading operation.

A bit line level insulating layer 82 is formed over the drain regions 68 and the alternating stacks (31, 33). Openings are formed in the bit line level insulating layer 82 to expose the drain regions 68. Bit lines 98 and optional drain contact via structures 88 are formed in the openings in electrical contact with the drain regions 68.

Referring to all drawings from FIG. 5A to 13D, a memory device is provided, which comprises at least one ferroelectric memory string. Each of the at least one ferroelectric memory string comprises: a semiconductor channel (59, 60) extending between a source region 28 and a drain region 68; a gate dielectric layer 52 located on a first lengthwise surface (which is a first vertical surface) of the semiconductor channel 60; pass gate electrodes 36 located on the gate dielectric layer 52 and extending between the source region and the drain region 68; and word lines 46 located over a second lengthwise surface of the semiconductor channel (59, 60) between the source region 28 and the drain region 68, wherein the second lengthwise surface is located on an opposite side of the first lengthwise surface, and each of the word lines 46 is spaced from the second lengthwise surface by a respective ferroelectric material portion (which is a portion of a ferroelectric material layer 54) and a respective interlayer dielectric portion (which is a portion of a respective interlayer dielectric layer 56).

In one embodiment, interlayer dielectric portions within each of the at least one ferroelectric memory string comprises portions of the interlayer dielectric layer 56 that extends across each of the word lines 46.

In one embodiment, the source region 28 is located in an upper portion of a substrate semiconductor layer 9 that underlies the word lines 46, and the first lengthwise surface and the second lengthwise surface are perpendicular to a top surface of the substrate semiconductor layer 9.

In one embodiment, each of the word lines 46 is located at a same vertical distance from a top surface of the substrate semiconductor layer 9 as a respective one of the pass gate electrodes 36 within each ferroelectric memory string. In one embodiment, each of the word lines 46 has a same material composition as, and a same thickness as, the respective one of the pass gate electrodes 36.

In one embodiment, the gate dielectric layer 52, the semiconductor channel 60, the ferroelectric material portions 54, and the interlayer dielectric portions 56 within each ferroelectric memory string have a same width along a direction (such as the first horizontal direction hd1) that is perpendicular to a lengthwise direction (i.e., the vertical direction) of the semiconductor channel 60 and is parallel to the first lengthwise surface and the second lengthwise surface.

In one embodiment, the semiconductor channel 60 within each ferroelectric memory string has a hollow rectangular horizontal cross-sectional shape having an outer rectangular periphery and an inner rectangular periphery (for example, as illustrated in FIG. 13B).

In one embodiment, the at least one ferroelectric memory string comprises at least one row of ferroelectric memory strings that are laterally spaced apart along a first horizontal direction hd1; each of the word lines 46 laterally extends along the first horizontal direction hd1 and are shared among each row of ferroelectric memory strings; and each of the pass gate electrodes 36 laterally extends along the first horizontal direction hd1 and are shared among each row of ferroelectric memory strings.

In one embodiment, the memory device comprises a two-dimensional array of ferroelectric memory strings that comprises a plurality of rows of ferroelectric memory strings that are laterally spaced along a second horizontal direction hd2 that is perpendicular to the first horizontal direction hd1.

Third exemplary structures in various configurations of the third embodiment can be derived from the second exemplary structure of the second embodiment. FIGS. 14A-14D, 15A and 15B, and 16A-16C illustrate various configuration of the third exemplary structure of the third embodiment that can be derived from the second exemplary structure of the second embodiment.

Referring to FIGS. 14A-14D, a first configuration of the third exemplary structure according to a third embodiment of the present disclosure is illustrated, which includes a three-dimensional array of discrete ferroelectric memory portions 154 instead of ferroelectric material layers 54 illustrated in the second embodiment. The discrete ferroelectric memory portions 154 comprise the same ferroelectric material as the ferroelectric material layers 54. The discrete ferroelectric memory portions 154 are located in lateral recesses between adjacent insulating strips 32 adjacent to the word lines 46. The discrete ferroelectric memory portions 154 located adjacent to the same vertical semiconductor channel 60 are vertically separated from each other by the respective one of the insulating strips 32.

Optionally, a blocking dielectric portion 157 is located between each word line 46 and the adjacent discrete ferroelectric memory portion 154. The blocking dielectric portion 157 may be located in the same lateral recesses as the adjacent discrete ferroelectric memory portion 154. The blocking dielectric portion 157 may comprise any suitable electrically insulating material, such as silicon oxide, silicon nitride, silicon oxynitride or a dielectric metal oxide, such as aluminum oxide.

The first configuration of the third exemplary structure also includes dielectric pillar structures 364 which may be wider in the first horizontal direction hd1 than the dielectric pillar structures 64 of the second exemplary structure. In one embodiment, each of the dielectric pillar structures 364 can have a respective rectangular horizontal cross-sectional shape. The vertical semiconductor channels 60 in the first configuration of the third exemplary structure have a strip shape that extends in the first horizontal direction hd1, as shown in FIGS. 14B and 14D rather than a hollow rectangle shape of the second exemplary structure shown in FIG. 13D.

A laterally alternating sequence of memory pillar structures (52, 60, 62, 68, 56, 154, 157) and dielectric pillar structures 364 can be located in each line trench which extends in the first horizontal direction hd1. A two-dimensional array of memory pillar structures (52, 60, 62, 68, 56, 154, 157) can be provided, which includes a three-dimensional array of discrete ferroelectric memory portions 154.

Referring to FIGS. 15A and 15B, a second configuration of the third exemplary structure is illustrated, which can be derived from the first configuration of the third exemplary structure. In the second configuration, the insulating strips 32 of the first configuration are replaced with cavity-containing insulating strips 332. The cavity-containing insulating strips 332 may include a cavity (i.e., air gap) 333 surrounded by the dielectric material of the cavity-containing insulating strips 332, such as silicon oxide.

The cavity-containing insulating strips 332 may be formed by selectively removing the insulating strips 32 before or after forming the word lines 46 to form lateral recesses. A dielectric material layer can be deposited by a non-conformal deposition process (such as plasma enhanced chemical vapor deposition) in the lateral recesses, thereby forming cavity-containing insulating strips 332. The dielectric material can include, for example, porous or non-porous organosilicate glass or a silicate glass. Each of the cavity-containing insulating strips 332 can include a respective encapsulated cavity 333 (e.g., air gap) that is free of any solid phase material and an encapsulating insulating material portion. Each encapsulated cavity may be filled with an inert gas or air. Each encapsulating insulating material portion includes a closed inner surface that defines the extent of the encapsulated cavity therein.

Generally, the layout of the dielectric pillar structures 364 may be selected to facilitate electrical wiring of various metal interconnect structures to be subsequently formed. For example, each of the drain regions 68 can be contacted by a respective drain contact via structure 88 (shown in FIG. 13C). Bit lines 98 (shown in FIG. 13C) that laterally extend along the second horizontal direction hd2 can be formed on a respective subset of the drain contact via structures 88. The dielectric pillar structures 364 in neighboring line trenches 49 may be aligned in rows in the second horizontal direction hd2, as illustrated in FIGS. 13B and 13D, 14B and 14D, and 15B.

Referring to FIGS. 16A and 16B, a third configuration of the third exemplary structure can be derived from the second configuration by staggering the dielectric pillar structures 364 along the second horizontal direction hd2. In this case, neighboring rows of dielectric pillar structures 364 can be laterally offset along the first horizontal direction by p/N, in which p is the pitch (i.e., the center-to-center distance between neighboring pairs) of the dielectric pillar structures 364 within each row of dielectric pillar structures 364 located in a respective line trench 49, and N is an integer greater than 1. N can be, for example, 2, 3, 4, 5, etc. Lateral offset of the drain regions 68 facilitates wiring of the drain contact via structures to the bit lines.

Referring to FIGS. 14A-16B and according to various embodiments of the present disclosure, a three-dimensional memory device is provided, which comprises: vertically alternating stacks (31, 33) of insulating strips (32 or 332) and electrically conductive strips (46, 36, 44, 66) located over a substrate 9, wherein the vertically alternating stacks laterally extend along a first horizontal direction hd1 and are laterally spaced apart among one another along a second horizontal direction hd2 by line trenches 49; and laterally alternating sequences of memory pillar structures (157, 154, 56, 60, 62, 68, 52) and dielectric pillar structures 364 that are located in the line trenches 49, wherein each of the memory pillar structures (157, 154, 56, 60, 62, 68, 52) comprises: a vertical semiconductor channel 60 contacting the substrate (9, 28) and extending to a horizontal plane including topmost surfaces of the vertically alternating stacks (31, 33); a gate dielectric layer 52 contacting a first sidewall of the vertical semiconductor channel 60 and electrically conductive strips (36, 66) within a first vertically alternating stack 33 of a pair of alternating stacks (31, 33); the interlayer dielectric layer 56 contacting a second sidewall of the vertical semiconductor channel 60 and electrically conductive strips (46, 44) within a second vertically alternating stack 31; and a vertical stack of discrete ferroelectric material portions 154 located between the interlayer dielectric layer 56 and electrically conductive strips (46, 44) of the second vertically alternating stack 31. The electrically conductive strips (46, 36, 44, 66) may, or may not, include drain-side control gate electrodes 44 and/or drain-side select gate electrodes 66.

In one embodiment, the vertical semiconductor channel 60 comprises: a first vertically-extending portion including the first sidewall; a second vertically-extending portion including the second sidewall; and a horizontal portion adjoined to a bottom end of the first vertically-extending portion and a bottom end of the second vertically extending portion.

In one embodiment, a rectangular dielectric core 62 is located between the first vertically-extending portion and the second vertically-extending portion, overlies the horizontal portion of the vertical semiconductor channel 60, and contacts a respective pair of dielectric pillar structures 364.

In one embodiment, the vertical semiconductor channel 60 comprises a semiconductor material having a doping of a first conductivity type; and a drain region 68 including a semiconductor material having a doping of second conductively type contacts an upper end of the vertical semiconductor channel 60. In one embodiment, the substrate 9 contains a source region 28 electrically connected to the vertical semiconductor channel 60.

In one embodiment, the three-dimensional memory device comprises blocking dielectric portions 157 located between the vertical stack of discrete ferroelectric material portions 154 and the electrically conductive strips (46, 44) of the second vertically alternating stack 31.

In one embodiment, each of the blocking dielectric portions 157 contacts, and has a same height as, a respective one of the electrically conductive strips (46, 44) of the second vertically alternating stack 31. In one embodiment, each of the blocking dielectric portions 157 contacts, and has a same height and a same width as, a respective one of the discrete ferroelectric material portions 154 in the vertical stack of discrete ferroelectric material portions 154.

In one embodiment, the vertical semiconductor channel 60, the gate dielectric layer 52, the interlayer dielectric layer 56, and the vertical stack of discrete ferroelectric material portions 154 within each memory pillar structure (157, 154, 56, 60, 62, 68, 52) has a uniform width along the first horizontal direction hd1.

In one embodiment, a subset of the insulating strips 332 comprises a respective cavity 333 therein, wherein each cavity is free of any solid phase material.

Fourth exemplary structures in various configurations of the fourth embodiment can be derived from the second and third exemplary structures of the second and third embodiments. FIGS. 17A-17C, 18A-18C, 19A and 19B, and 20 illustrate various configuration of the fourth exemplary structure of the fourth embodiment that can be derived from the second and third exemplary structures of the second and third embodiments.

Figure 17C:
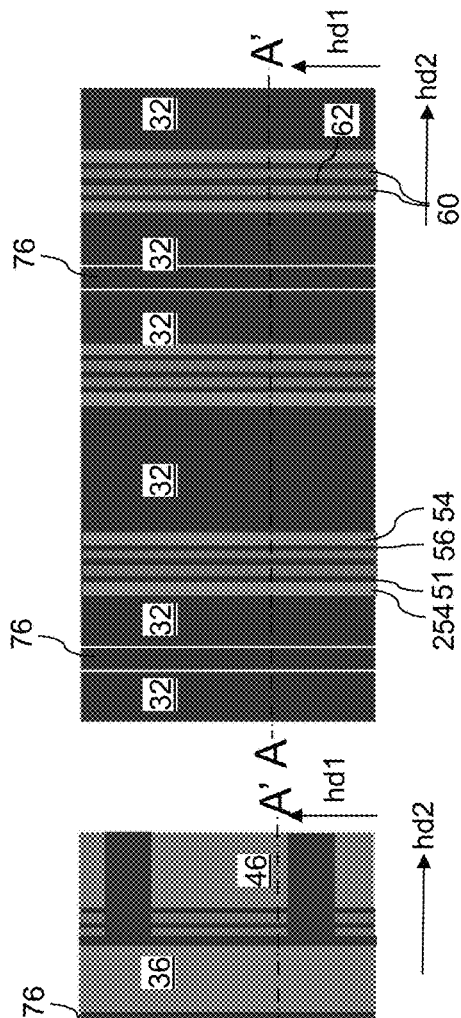
FIG. 17C is a horizontal cross-sectional view of the first configuration of the fourth exemplary structure along the horizontal plane C-C' of FIG. 17A. The vertical plane A-A' is a plane of the vertical cross-sectional view of FIG. 17A.
Figure 17B:
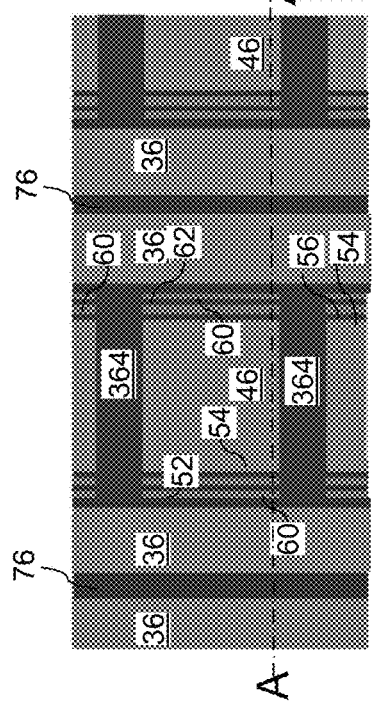
FIG. 17B is a horizontal cross-sectional view of the first configuration of the fourth exemplary structure along a horizontal plane B-B' of FIG. 17A. The vertical plane A-A' is a plane of the vertical cross-sectional view of FIG. 17A.
Figure 17A:
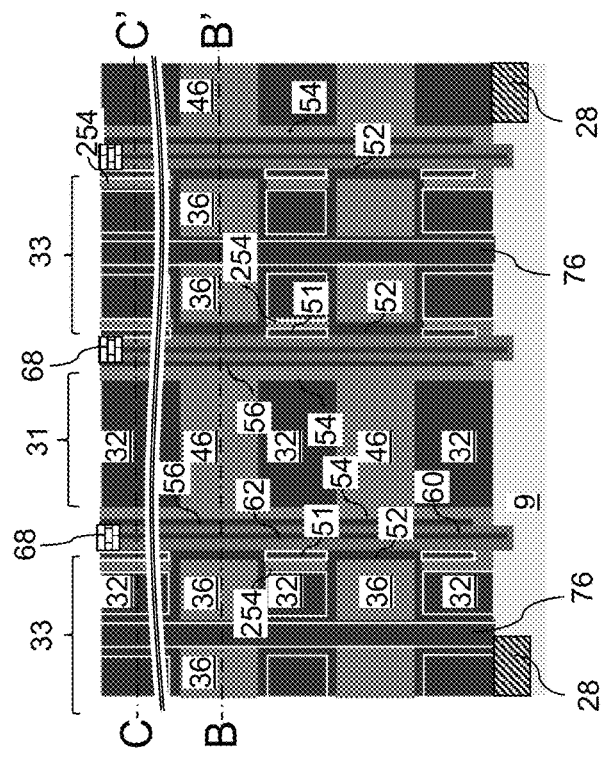
FIG. 17A is a vertical cross-sectional view of a first configuration of a fourth exemplary structure including a three-dimensional array of ferroelectric memory elements according to a fourth embodiment of the present disclosure.

Referring to FIGS. 17A-17C, a first configuration of the fourth exemplary structure according to the fourth embodiment of the present disclosure is illustrated, which includes the ferroelectric material layers 54 of the second embodiment and dummy discrete ferroelectric memory portions 254 instead of the discrete ferroelectric memory portions 154 of the third embodiment. The dummy discrete ferroelectric memory portions 254 of the fourth embodiment are located in a vertical level adjacent to the insulating strips 32 between the vertical levels of the pass gate electrodes 36. In other words, the dummy discrete ferroelectric memory portion 254 is located between a first horizontal plane corresponding to a top surface of the closest underlying pass gate electrode 36 and a second horizontal plane corresponding to a bottom surface of the closest overlying pass gate electrode 36. Thus, the pass gate electrodes 36 are located at different distances from the substrate 9 than the dummy discrete ferroelectric memory portions 254. In other words, the dummy discrete ferroelectric memory portions 254 are located adjacent to the pass gate type stacks 33 and are not intended to store data (e.g., 1 or 0). In contrast, the ferroelectric material layers 54 are located adjacent to the word line type stacks 31 and portions of the ferroelectric material layers 54 located adjacent to the word lines 46 function as memory cells which are used to store data (e.g., 1 or 0).

The dummy discrete ferroelectric memory portions 254 of the fourth embodiment are located in the same vertical level as, and laterally between, respective insulating strips 32 and dummy spacer dielectric layers 51. The dummy spacer dielectric layers 51 are located in the same vertical level as, and laterally between, respective dummy discrete ferroelectric memory portions 254 and the vertical semiconductor channel 60. In other words, the dummy discrete ferroelectric memory portion 254, its laterally adjacent insulating strip 32 and its laterally adjacent dummy dielectric 51 are located between the first horizontal plane corresponding to a top surface of the closest underlying pass gate electrode 36 and a second horizontal plane corresponding to a bottom surface of the closest overlying pass gate electrode 36

Furthermore, in the fourth embodiment, the dielectric pillar structures (64, 364) of the second and third embodiments may be omitted if desired. Instead, a dielectric trench fill structure 76 may be formed in trenches which extend through the pass gate type stacks 33. The dielectric trench fill structures 76 extend continuously in the first horizontal direction hd1 and laterally separate the pass gate electrodes 36.

Referring to FIGS. 18A and 18B, a second configuration of the fourth exemplary structure can be derived from the first configuration of the fourth exemplary structure by reducing the vertical height of the dummy discrete ferroelectric memory portions 254 such that each dummy discrete ferroelectric memory portion 254 is vertically spaced farther from overlying and underlying pass gate electrodes 36 than in the first configuration. For example, each dummy discrete ferroelectric memory portion 254 is vertically spaced farther from overlying and underlying pass gate electrodes 36 by respective overlying and underlying protruding portions 32P of the insulating strips 32. The protruding portions 32P protrude horizontally (i.e., laterally) from each insulating strip 31. The respective overlying and underlying protruding portions 32P of the insulating strips 32 overly and underly the respective dummy discrete ferroelectric memory portion 254 in the vertical direction perpendicular to the substrate 9.

Referring to FIG. 18C, a third configuration of the fourth exemplary structure can be derived from the second configuration of the fourth exemplary structure by increasing the vertical height of the pass gate electrodes 36 in regions overlying and underlying the reduced height dummy discrete ferroelectric memory portions 254. For example, each pass gate electrode 36 contains upper and lower protruding portions 36P. The respective upper and lower protruding portions 36P of the pass gate electrodes overly and underly the respective adjacent dummy discrete ferroelectric memory portions 254 in the vertical direction perpendicular to the substrate 9. The protruding portions 36P protrude vertically from the pass gate electrode 36. Thus, each dummy discrete ferroelectric memory portion 254 is located between a respective overlying protruding portion 36P of an underlying pass gate electrode 36 and a respective underlying protruding portion 36P of an overlying pass gate electrode 36 in the vertical direction perpendicular to the substrate 9.

Figure 19B:
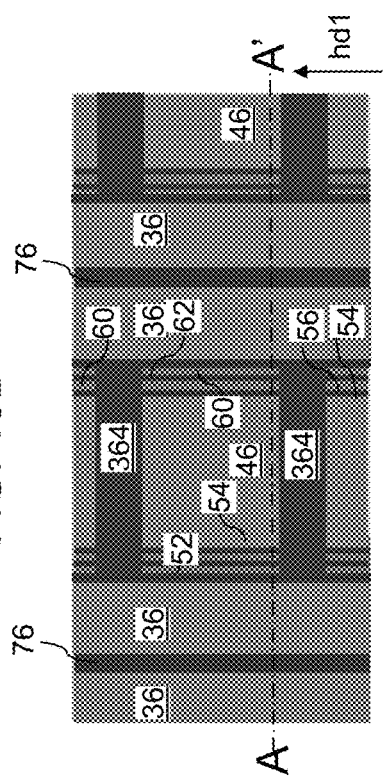
FIG. 19B is a horizontal cross-sectional view of the fourth configuration of the fourth exemplary structure along a horizontal plane B-B' of FIG. 19A. The vertical plane A-A' is a plane of the vertical cross-sectional view of FIG. 19A.
Figure 19A:
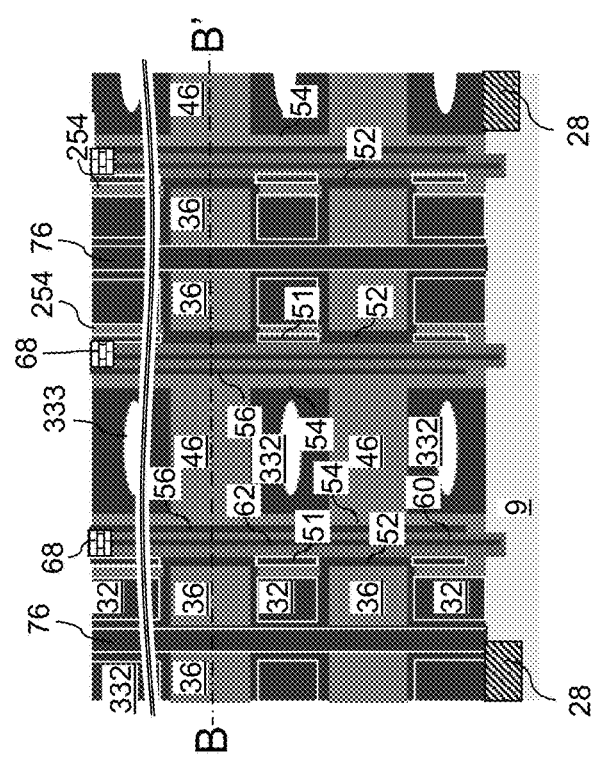
FIG. 19A is a vertical cross-sectional view of a fourth configuration of the fourth exemplary structure including a three-dimensional array of ferroelectric memory elements according to the fourth embodiment of the present disclosure.

Referring to FIGS. 19A and 19B, a fourth configuration of the fourth exemplary structure can be derived from the first configuration, second or third configuration of the fourth exemplary structure by replacing the first insulating strips 32 in the word line type stack 31 of the first, second or third configuration with cavity-containing insulating strips 332 containing a cavity (i.e., air gap) 333 between the word lines 46 in the word line type stack 31.

Figure 20:
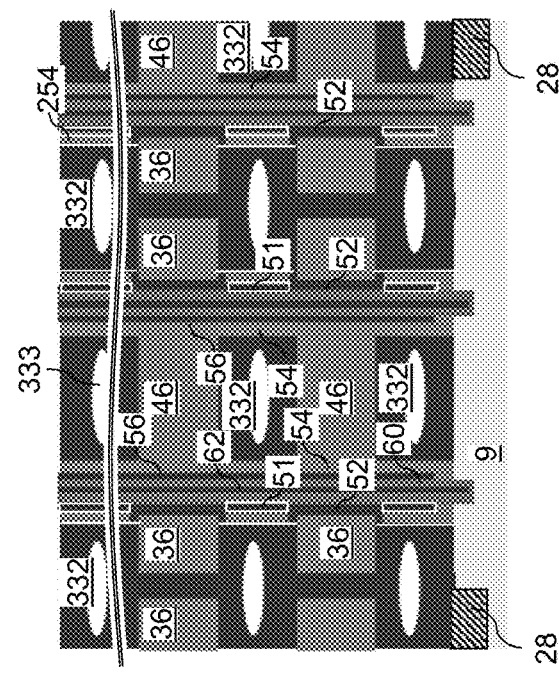
FIG. 20 is a vertical cross-sectional view of a fifth configuration of the fourth exemplary structure including a three-dimensional array of ferroelectric memory elements according to the fourth embodiment of the present disclosure.

Referring to FIG. 20, a fifth configuration of the fourth exemplary structure can be derived from the fourth configuration by also replacing the second insulating strips 32 in the pass gate type stack 33 of the fourth configuration with cavity-containing insulating strips 332 containing a cavity (i.e., air gap) 333 between the pass gate electrodes 36 in the pass gate type stack 33 in addition to forming the cavities 333 in the word line type stack 31.

Referring to FIGS. 17A-20 and according to various embodiments of the present disclosure, a three-dimensional memory device is provided, which comprises: a first vertically alternating stack 31 of first insulating strips (32 or 332) and first electrically conductive strips comprising word lines 46 located over a substrate 9, wherein the first vertically alternating stack 31 laterally extends along a first horizontal direction hd1; a second vertically alternating stack 33 of second insulating strips (32 or 332) and second electrically conductive strips comprising pass gate electrodes 36 located over the substrate 9, wherein the second vertically alternating stack 33 laterally extends along the first horizontal direction hd1 and is laterally spaced from the first alternating stack 31 along a second horizontal direction hd2; and a memory structure assembly comprising a combination of a line trench fill structure (254, 51, 60, 62, 68, 56, 54) located between the first vertically alternating stack 31 and the second vertically alternating stack 33, and portions of a gate dielectric layer 52 that are located between adjacent pass gate electrodes 36 and the line trench fill structure (254, 51, 60, 62, 68, 56, 54). The memory structure assembly (254, 51, 60, 62, 68, 56, 54, 52) comprises: a first ferroelectric material layer 54 contacting sidewalls of each of the first insulating strips (32 or 332) and the first electrically conductive strips (i.e., the word lines 46); and dummy second ferroelectric material portions 254 located over sidewalls of the second vertically alternating stack 33; and a vertical semiconductor channel 60 located between the first ferroelectric material layer (i.e., the ferroelectric material layer 54) and the dummy ferroelectric material portions 254. The semiconductor channel 60 vertically extends from the substrate 9 to a horizontal plane including topmost surfaces of the first vertically alternating stack 31 and the second vertically alternating stack 33.

In one embodiment, the three-dimensional memory device comprises an interlayer dielectric layer 56 contacting the first ferroelectric material layer (i.e., the ferroelectric material layer 54) and a first outer sidewall of the vertical semiconductor channel 60.

In one embodiment, a spacer dielectric layer 51 contacts a second outer sidewall of the vertical semiconductor channel 60. In one embodiment, the spacer dielectric layer 51 can have a same composition and a same thickness as the interlayer dielectric layer 56. In one embodiment, the vertical semiconductor channel 60 comprises a first vertically extending portion including the first outer sidewall, a second vertically extending portion including the second outer sidewall, and a horizontal portion connecting a bottom end of the first vertically extending portion and a bottom end of the second vertically extending portion and contacting a top surface of the substrate 9.

In one embodiment, a subset of the first insulating strips (32 or 332) and the second insulating strips (32 or 332) comprises a respective cavity 333 therein. Each cavity is free of any solid phase material.

Figure 21A:
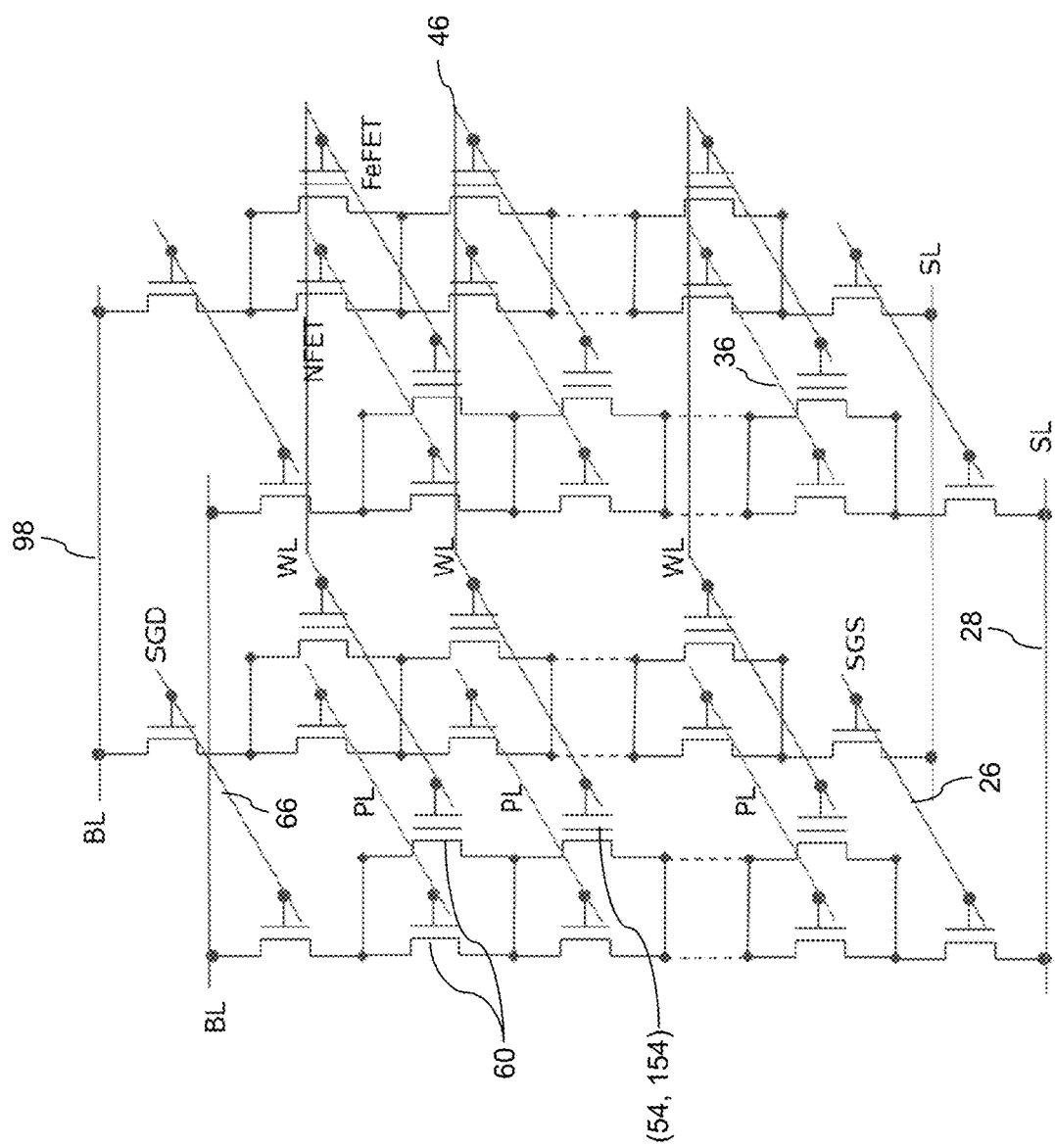
FIG. 21A is a circuit schematic for the second, third, and fourth exemplary structures of the present disclosure.

FIG. 21A is a circuit schematic for the first, second, third, and fourth exemplary structures of the present disclosure. Each pass gate electrode PL (which corresponds to a pass gate electrode 36 of the devices described above) of a pass gate field effect transistor (which is represented by a NFET in FIG. 21A) provides a parallel gated conductive path to each vertical ferroelectric-memory-element-controlled transistor (FeFET) controlled by a word line WL (which correspond to a word line 46 of the devices described above). The respective NFET and FeFET share a common semiconductor channel (60, 160) and are connected electrically in parallel between a common source line SL (e.g., 28) and a common bit line BL (e.g., 98). In one embodiment, a plurality of FeFETs electrically connected in series between the source line SL (e.g., 28) and the bit line BL (e.g., 98) share a common semiconductor channel (60, 160) and common drain side and source side select gate transistors SGD, SGS (containing the respective drain side and source select gate electrodes (26, 66)) with a plurality of pass gate transistors (NFETs) which are also connected in series between the same source line SL and the same bit line BL as the plurality of FeFETs. While the pass gate transistors are illustrated as NFETs, these transistors may alternatively comprise PFETs if desired.

The plurality of series connected FeFETs form a NAND string which includes a series connection of field effect transistors having a variable threshold voltage that is controlled by the polarization of a respective ferroelectric material portion adjacent to a respective word line WL. The first end of each NAND string (e.g., the bottom end of each vertical NAND string) is connected to a source line SL, which can comprise the source region 28 in the devices illustrated above. The second end of each NAND string (e.g., the top end of each vertical NAND string) is connected to a bit line BL (e.g., 98). Optionally, source-side select gate electrodes 26 and drain-side select gate electrodes 66 can be provided.

FIGS. 21B and 21C are tables illustrating exemplary voltages that may be used to operate the circuit of FIG. 21A. FIG. 21B illustrates the exemplary voltages that may be used to operate a single level cell in a channel boosting scheme (columns 2, 3 and 4) and in a direct channel potential control scheme (columns 5, 6 and 7). FIG. 21C illustrates the exemplary voltages that are used to operate a multi-level cell in the channel boosting scheme (columns 2, 3 and 4) and in the direct channel potential control scheme (columns 5, 6 and 7). The voltages shown are exemplary and other suitable voltages may be used for different device dimensions and materials.

As shown in these tables, the selected word line 46 (i.e., the word line of the selected memory cell) is set to a high negative voltage for write/inhibit, to a high positive voltage for erase/inhibit and to 0V or a low positive/negative voltage for read/inhibit. The unselected word lines are floating for write and erase and set to 0V for read/inhibit. The selected pass gate electrode 36 (i.e., the pass gate electrode adjacent to the selected memory cell) is set to a pass voltage for write and erase and set to 0V for read/inhibit. The unselected pass gate electrodes are set to the pass voltage for write and erase and set to the read voltage for read/inhibit. The bit lines are set to 0V/positive voltage for write/inhibit and erase/inhibit and set to $V_{dd}$ for read/inhibit for the channel boosting scheme, and are set to 0V/negative voltage for write/inhibit, set to 0V/positive voltage for erase/inhibit, and set to $V_{dd}$ for read/inhibit for the direct channel potential control scheme. The source lines are set to a positive voltage for write/inhibit and erase/inhibit and to 0V for read/inhibit. The SGD and SGS select transistors are set as shown in the tables. The operating units are per page of the device.

The various configurations of the exemplary structure provide memory devices comprising at least one ferroelectric memory string containing word lines and pass gate electrodes. In other words, the word lines 46 and ferroelectric memory elements (i.e., ferroelectric material portions 54, 154) are located on at least one side of the semiconductor channel, 60 and pass gate electrodes 36 and a gate dielectric 52 are located on at least one other side of the semiconductor channel 60.

The pass gate transistors which include pass gate electrodes 36 but which lack the ferroelectric memory elements (i.e., ferroelectric material portions 54, 154) decrease or eliminate the disturb between adjacent memory cells (i.e., between adjacent FeFETs) in the same memory string.

Referring to all figures and embodiments of the present disclosure, a memory device includes a semiconductor channel (60, 160) extending between a source region 28 and a drain region 68, a plurality of pass gate electrodes 36, a plurality of word lines 46, a gate dielectric 52 located between the semiconductor channel (60, 160) and the plurality of pass gate electrodes 36, and ferroelectric material portions (54, 154) located between the semiconductor channel and the plurality of word lines 46.

In one embodiment, the gate dielectric 52 comprises a gate dielectric layer located on a first lengthwise surface of the semiconductor channel (60, 160), the pass gate electrodes 36 are located on the gate dielectric layer in a first row between the source region and the drain region, the word lines 46 are located over a second lengthwise surface of the semiconductor channel in a second row between the source region 28 and the drain region 68, the second lengthwise surface is located on an opposite side of the first lengthwise surface of the semiconductor channel (60, 160), and each of the word lines 46 is spaced from the second lengthwise surface by one of the respective ferroelectric material portions (54, 154) and a respective interlayer dielectric portion 56.

In one embodiment, the interlayer dielectric portions 56 comprise portions of an interlayer dielectric layer located between the second lengthwise surface of the semiconductor channel and the ferroelectric material portions (54, 154). In one embodiment, the ferroelectric material portions (54, 154) comprise portions of a ferroelectric material layer 54 located over the second lengthwise surface of the semiconductor channel (60, 160) that extends from a region that overlies the source region 28 to a region that overlies the drain region 68. In another embodiment, the ferroelectric material portions (54, 154) comprise discrete ferroelectric material portions 154 that are spaced apart by intervening dielectric material portions (32, 142). In one embodiment, the ferroelectric material portions (54, 154) comprise orthorhombic phase hafnium oxide including at least one dopant selected from at least one of Al, Zr or Si.

In the first embodiment illustrated in FIGS. 1-4B, the semiconductor channel 160 extends horizontally over an insulating material layer 10 having a horizontal top surface, and the first lengthwise surface and the second lengthwise surface of the semiconductor channel are parallel to the horizontal top surface of the insulating material layer 10.

In the second embodiment illustrated in FIGS. 5A-13D, the semiconductor channel 60 extends vertically over a substrate 9 having a horizontal top surface, and a first lengthwise surface and a second lengthwise surface of the semiconductor channel 60 are perpendicular to the horizontal top surface of the substrate 9.

In one embodiment, the source region 28 is located in an upper portion of the substrate 9 that underlies the word lines 46, each of the word lines 46 is located at a same vertical distance from the top surface of the substrate 9 as a respective one of the pass gate electrodes 36, and each of the word lines 46 has a same material composition as, and a same thickness as, the respective one of the pass gate electrodes 36.

In one embodiment, the word lines 46 are separated from each other by respective first insulating strips (32, 332) in a word line type stack 31, and the pass gate electrodes 36 are separated from each other by respective second insulating strips (32, 332) in a pass gate type stack 33.

In one embodiment, the semiconductor channel 60 has a hollow rectangular horizontal cross-sectional shape having an outer rectangular periphery and an inner rectangular periphery. The ferroelectric material portions (54, 154) are located in a plurality of rows of ferroelectric memory strings that are laterally spaced apart along a first horizontal direction hd1 and that extend in a second horizontal direction hd2 perpendicular to the first horizontal direction, each of the word lines 46 laterally extends along the first horizontal direction and is shared between the plurality of rows of ferroelectric memory strings, and each of the pass gate electrodes 36 laterally extends along the first horizontal direction and is shared between the plurality of rows of ferroelectric memory strings.

In the second, third and fourth embodiments, the three-dimensional memory device comprises a word line type stack 31 of alternating first insulating strips (32, 332) and word lines 46 located over a substrate 9, a pass gate type stack 33 of alternating second insulating strips (32, 332) and pass gate electrodes 36 located over the substrate 9, a vertical semiconductor channel 60 located between the pass gate type stack 33 and the word line type stack 31, a gate dielectric 52 located between the vertical semiconductor channel 60 and the pass gate type stack 33, and ferroelectric material portions (54, 154) located between the vertical semiconductor channel 60 and the word line type stack 31.

In the third embodiment illustrated in FIGS. 14A-16B, the ferroelectric material portions (54, 154) comprise discrete ferroelectric material portions 154 located in lateral recesses adjacent to the word lines 46 and between adjacent first insulating strips 32, and the discrete ferroelectric memory portions 154 are vertically separated from each other by the respective one of the first insulating strips 32.

In one embodiment, the device further comprises an interlayer dielectric layer 56 contacting a second sidewall of the vertical semiconductor channel 60 and contacting the discrete ferroelectric memory portions 154, and the gate dielectric layer 52 contacts a first sidewall of the vertical semiconductor channel 60 and contacts the pass gate type stack 33.

In one embodiment the vertical semiconductor channel 60 comprises a first vertically-extending portion including the first sidewall, a second vertically-extending portion including the second sidewall, and a horizontal portion adjoined to a bottom end of the first vertically-extending portion and a bottom end of the second vertically extending portion.

In one embodiment, the device further comprises a pair of dielectric pillar structures 364 and a rectangular dielectric core 62 located between the first vertically-extending portion and the second vertically-extending portion of the vertical semiconductor channel 60, overlies the horizontal portion of the vertical semiconductor channel 60, and contacts the pair of dielectric pillar structures 364.

In one embodiment, the vertical semiconductor channel 60 comprises a semiconductor material having a doping of a first conductivity type, and a drain region 68 including a semiconductor material having a doping of second conductively type contacts an upper end of the vertical semiconductor channel. The substrate 9 comprises a source region 28 electrically connected to the vertical semiconductor channel 60.

In one embodiment, blocking dielectric portions 157 are located in the lateral recesses between the discrete ferroelectric material portions 154 and the word lines 46. Each of the blocking dielectric portions 157 contacts, and has a same height as, a respective one of the word lines 46. Each of the blocking dielectric portions 157 contacts, and has a same height and a same width as, a respective one of the discrete ferroelectric material portions 154. In one embodiment illustrated in FIG. 15A, the first and the second insulating strips 332 comprise a respective cavity 333 therein, wherein each cavity is free of any solid phase material.

In the fourth embodiment illustrated in FIGS. 17A-20, the ferroelectric material portions (54, 154) comprise portions of a ferroelectric material layer 54 located between the vertical semiconductor channel 60 and the word line type stack 31. Dummy discrete ferroelectric memory portions 254 are located between the vertical semiconductor channel 60 and the pass gate electrodes 36 in a vertical level adjacent to the second insulating strips (32, 332) between the vertical levels of the pass gate electrodes 36. The pass gate electrodes 36 are located at different distances from the substrate 9 than the dummy discrete ferroelectric memory portions 254.

In one embodiment illustrated in FIGS. 18A-18B, each dummy discrete ferroelectric memory portion 254 is vertically spaced from overlying and underlying pass gate electrodes 36 by respective overlying and underlying protruding portions 32P of the second insulating strips 32.

In another embodiment illustrated in FIG. 18C, each pass gate electrode 36 contains upper and lower protruding portions 36P. The upper and lower protruding portions 36P of the pass gate electrodes 36 overly and underly respective adjacent dummy discrete ferroelectric memory portions 254 in the vertical direction perpendicular to the substrate 9. Each dummy discrete ferroelectric memory portion 254 is located between respective overlying protruding portion of an underlying pass gate electrode and an underlying protruding portion of an overlying pass gate electrode in a vertical direction perpendicular to the substrate 9.

In one embodiment illustrated in FIG. 20, the first insulating strips and the second insulating strips 332 comprise a respective cavity 333 therein, wherein each cavity is free of any solid phase material.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A memory device, comprising:
a semiconductor channel extending between a source region and a drain region;
a plurality of pass gate electrodes;
a plurality of word lines;
a gate dielectric located between the semiconductor channel and the plurality of pass gate electrodes; and
a stack of an interlayer dielectric layer and ferroelectric material portions located between the semiconductor channel and the plurality of word lines, wherein the interlayer dielectric layer and the gate dielectric have a same material composition and a same thickness.

2. The memory device of claim 1, wherein:
the gate dielectric comprises a gate dielectric layer located on a first lengthwise surface of the semiconductor channel;
the pass gate electrodes are located on the gate dielectric layer in a first row between the source region and the drain region;
the word lines are located over a second lengthwise surface of the semiconductor channel in a second row between the source region and the drain region;
the second lengthwise surface is located on an opposite side of the first lengthwise surface; and
each of the word lines is spaced from the second lengthwise surface by one of the respective ferroelectric material portions and the interlayer dielectric layer.

3. The memory device of claim 2, wherein the interlayer dielectric layer is located between the second lengthwise surface of the semiconductor channel and the ferroelectric material portions.

4. The memory device of claim 2, wherein the ferroelectric material portions comprise portions of a ferroelectric material layer located over the second lengthwise surface of the semiconductor channel and that extends from a region that overlies the source region to a region that overlies the drain region.

5. The memory device of claim 2, wherein the ferroelectric material portions comprise discrete ferroelectric material portions that are spaced apart by intervening dielectric material portions.

6. The memory device of claim 1, wherein:
the semiconductor channel extends vertically over a substrate having a horizontal top surface; and
a first lengthwise surface and a second lengthwise surface of the semiconductor channel are perpendicular to the horizontal top surface of the substrate.

7. The memory device of claim 6, wherein:
the source region is located in an upper portion of the substrate that underlies the word lines;
each of the word lines is located at a same vertical distance from the top surface of the substrate as a respective one of the pass gate electrodes; and
each of the word lines has a same material composition as, and a same thickness as, the respective one of the pass gate electrodes.

8. The memory device of claim 6, wherein:
the word lines are separated from each other by respective first insulating strips in a word line type stack; and
the pass gate electrodes are separated from each other by respective second insulating strips in a pass gate type stack.

9. The memory device of claim 6, wherein the semiconductor channel has a hollow rectangular horizontal cross-sectional shape having an outer rectangular periphery and an inner rectangular periphery.

10. The memory device of claim 1, wherein:
the ferroelectric material portions are located in a plurality of rows of ferroelectric memory strings that are laterally spaced apart along a first horizontal direction and that extend in a second horizontal direction perpendicular to the first horizontal direction;
each of the word lines laterally extends along the first horizontal direction and is shared between the plurality of rows of ferroelectric memory strings; and
each of the pass gate electrodes laterally extends along the first horizontal direction and is shared between the plurality of rows of ferroelectric memory strings.

11. The memory device of claim 1, wherein the ferroelectric material portions comprise orthorhombic phase hafnium oxide including at least one dopant selected from at least one of Al, Zr or Si.

12. The memory device of claim 1, wherein the gate dielectric and the interlayer dielectric layer comprise remaining vertical portions of a continuous dielectric material layer that is aniostropically etched to remove its horizontal portions.

13. The memory device of claim 1, wherein:
the semiconductor channel contacts a surface of the gate dielectric at a first interface; and
the semiconductor channel contacts a surface of the interlayer dielectric layer at a second interface.

14. The memory device of claim 13, wherein:
the first interface and the second interface are vertical;
the first interface is located within a first vertical plane that is parallel to a first horizontal direction; and
the second interface is located within a second vertical plane that is parallel to the first horizontal direction and laterally spaced apart from the first vertical plane along a second horizontal direction that is perpendicular to the first horizontal direction.

15. The memory device of claim 1, further comprising a substrate including a substrate semiconductor layer having a horizontal top surface, wherein the gate dielectric and the interlayer dielectric layer extend along a vertical direction.

16. The memory device of claim 15, wherein the ferroelectric material portions are portions of a ferroelectric material layer that extends along the vertical direction.

17. The memory device of claim 16, wherein:
a bottom end of the gate dielectric is in direct contact with the top surface of the substrate semiconductor layer; and
a bottom end of the interlayer dielectric layer is vertically spaced from the top surface of the substrate semiconductor layer by a bottom portion of the ferroelectric material layer.

18. The memory device of claim 17, wherein the bottom portion of the ferroelectric material layer is in direct contact with the top surface of the substrate semiconductor layer.

19. The memory device of claim 17, wherein a sidewall of the bottom portion of the ferroelectric material layer directly contacts a sidewall of a bottom end of the semiconductor channel.

20. The memory device of claim 15, further comprising an alternating stack of insulating layers and electrically conductive layers overlying the substrate semiconductor layer, wherein each of the ferroelectric material portions are located between, and contacts horizontal surfaces of, a respective vertically neighboring pair of insulating layers within the alternating stack, and has a same height as a respective one of the electrically conductive layers.

* * * * *